(12) United States Patent
Haimoto et al.

(10) Patent No.: US 9,105,838 B2
(45) Date of Patent: *Aug. 11, 2015

(54) NONVOLATILE VARIABLE RESISTIVE DEVICE

(75) Inventors: Takashi Haimoto, Kanagawa (JP); Reika Ichihara, Kanagawa (JP); Haruka Kusai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 556 days.

This patent is subject to a terminal disclaimer.

(21) Appl. No.: 13/228,753

(22) Filed: Sep. 9, 2011

(65) Prior Publication Data

US 2012/0211719 A1    Aug. 23, 2012

(30) Foreign Application Priority Data

Feb. 18, 2011    (JP) .................. 2011-033063

(51) Int. Cl.
| | |
|---|---|
| *G11C 11/00* | (2006.01) |
| *H01L 45/00* | (2006.01) |
| *G11C 11/56* | (2006.01) |
| *G11C 13/00* | (2006.01) |
| *H01L 27/24* | (2006.01) |

(52) U.S. Cl.
CPC .......... *H01L 45/085* (2013.01); *G11C 11/5614* (2013.01); *G11C 13/0011* (2013.01); *H01L 27/2436* (2013.01); *H01L 27/2463* (2013.01); *H01L 45/1266* (2013.01); *H01L 45/148* (2013.01)

(58) Field of Classification Search
CPC .............. H01L 45/085; H01L 45/1233; H01L 45/1266; H01L 27/2463; H01L 27/2481; H01L 27/249; H01L 45/148; G11C 11/5614; G11C 13/0011
USPC ................................................... 257/2, 4, 214
See application file for complete search history.

(56) References Cited

U.S. PATENT DOCUMENTS

| | | | |
|---|---|---|---|
| 8,450,709 B2* | 5/2013 | Kusai et al. ................ 257/2 |
| 2010/0213433 A1* | 8/2010 | Yamamoto et al. ............... 257/4 |
| 2012/0007035 A1* | 1/2012 | Jo et al. ............................ 257/4 |
| 2012/0091420 A1* | 4/2012 | Kusai et al. ....................... 257/4 |

OTHER PUBLICATIONS

U.S. Appl. No. 13/052,165, filed Mar. 21, 2011, Haruka Kusai, et al.
Sung Hyun Jo, et al., "CMOS Compatible Nanoscale Nonvolatile Resistance Switching Memory", Nano Letters, vol. 8, 2008, 6 Pages.

* cited by examiner

*Primary Examiner* — Laura Menz
*Assistant Examiner* — Candice Y Chan
(74) *Attorney, Agent, or Firm* — Oblon, McClelland, Maier & Neustadt, L.L.P.

(57) ABSTRACT

According to one embodiment, a first electrode includes a metal element. A second electrode includes a semiconductor element. A third electrode includes a metal element. A first variable resistive layer is arranged between the first electrode and the second electrode and is capable of reversibly changing a resistance by filament formation and dissolution of the metal element of the first electrode. A second variable resistive layer is arranged between the second electrode and the third electrode and is capable of reversibly changing a resistance by filament formation and dissolution of the metal element of the third electrode.

8 Claims, 20 Drawing Sheets

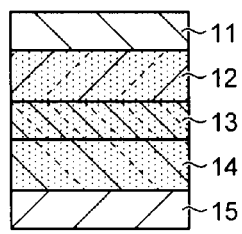
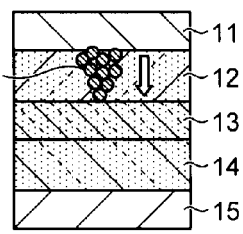
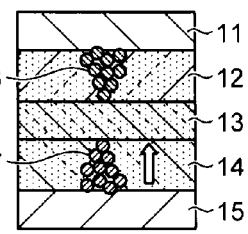
FIG.3A  FIG.3B  FIG.3C
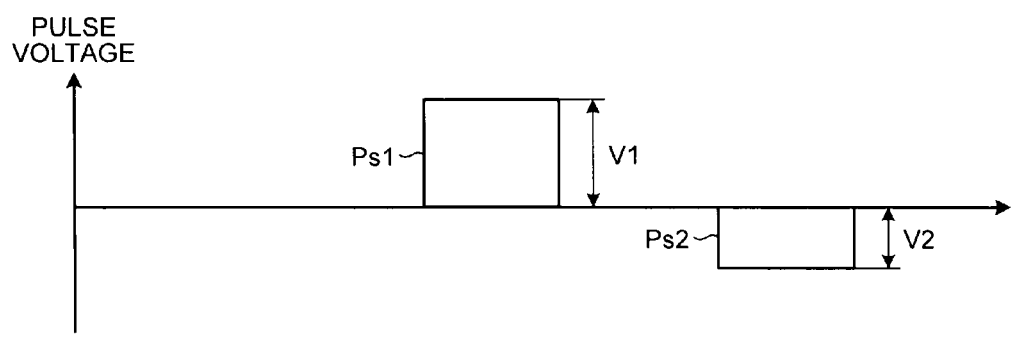
FIG.3D
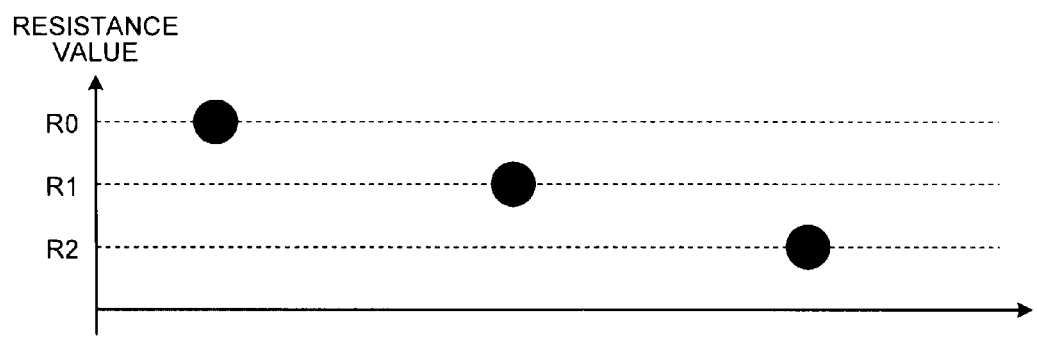
FIG.3E FIG.8A  FIG.8B  FIG.8C
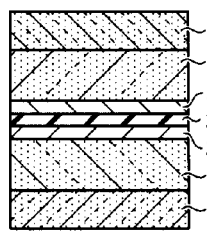
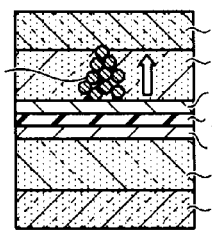
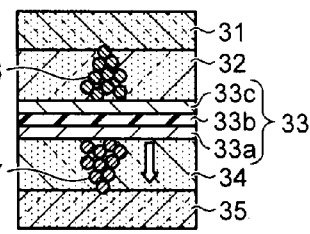
FIG.8D
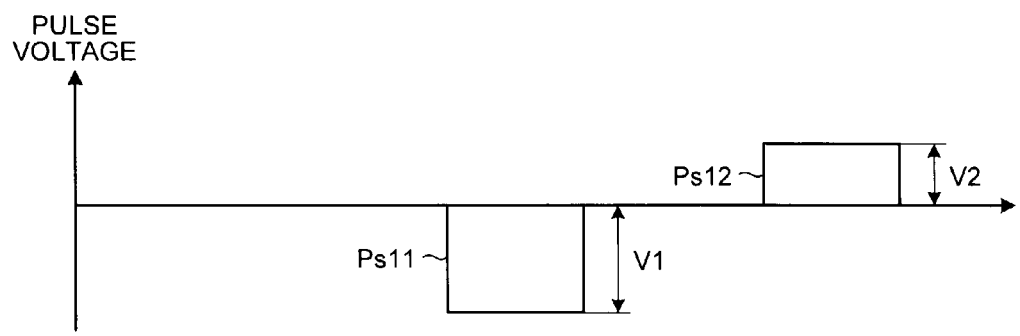
FIG.8E
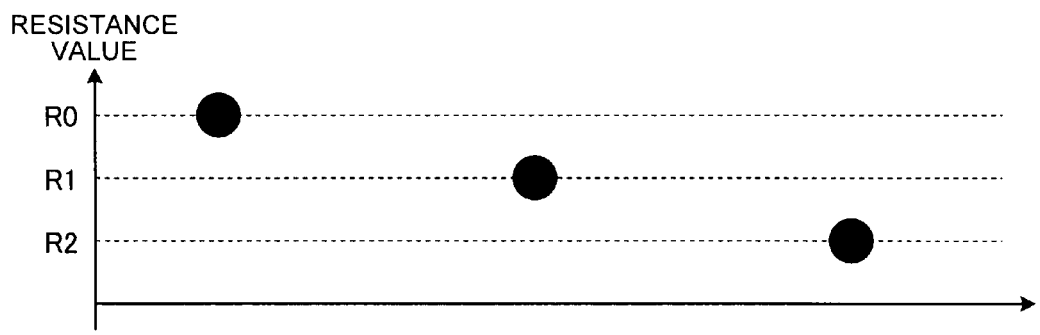

FIG.9A  FIG.9B  FIG.9C
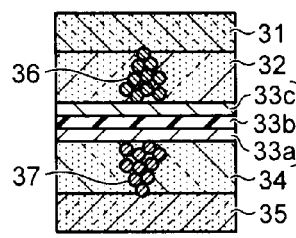 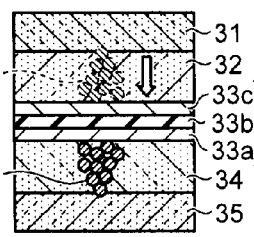 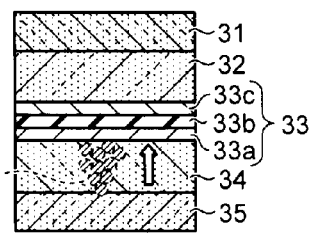
FIG.9D
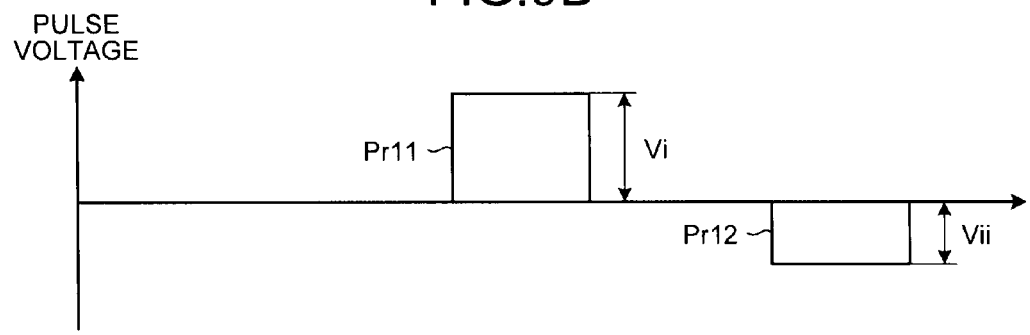
FIG.9E
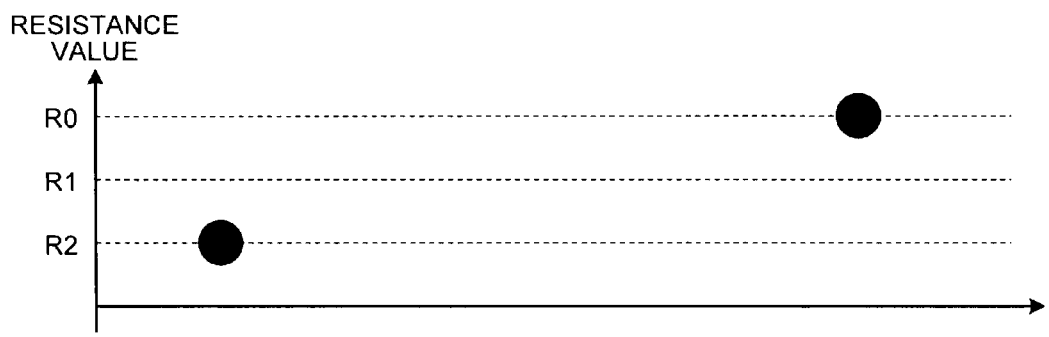

FIG.13A    FIG.13B    FIG.13C
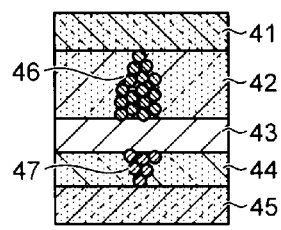
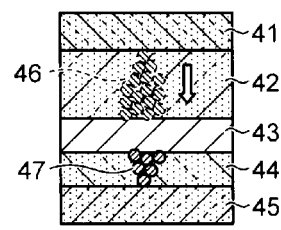
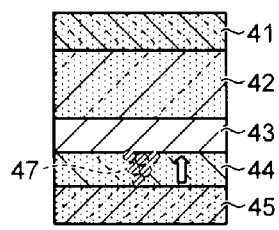
FIG.13D
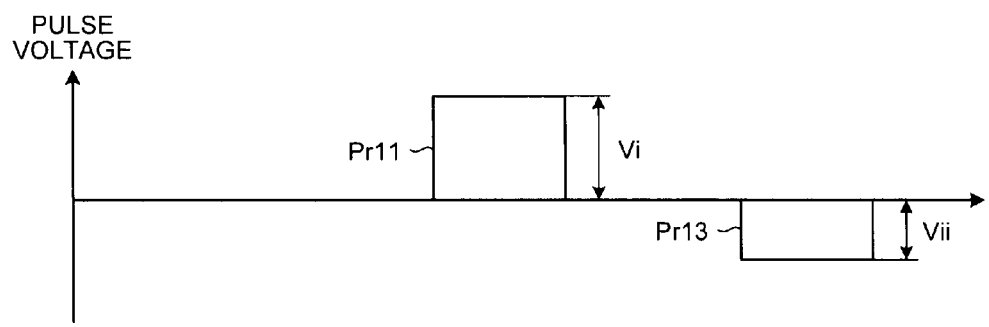
FIG.13E
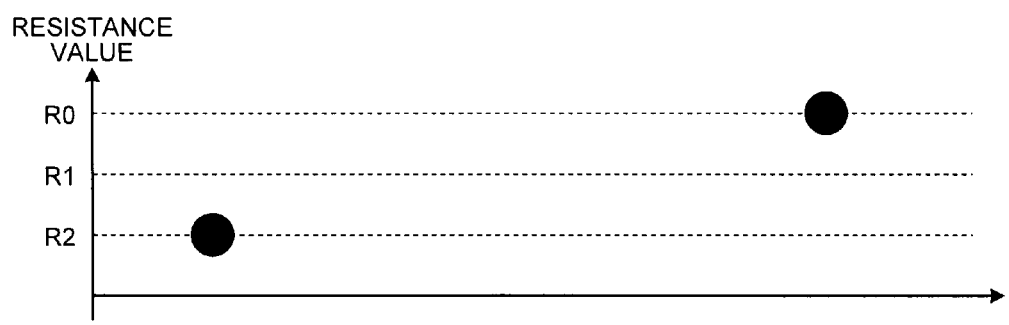

NONVOLATILE VARIABLE RESISTIVE DEVICE

CROSS-REFERENCE TO RELATED APPLICATIONS

This application is based upon and claims the benefit of priority from the prior Japanese Patent Application No. 2011-33063, filed on Feb. 18, 2011; the entire contents of which are incorporated herein by reference.

FIELD

Embodiments described herein relate generally to a nonvolatile variable resistive device.

BACKGROUND

Recently, development of two-terminal nonvolatile variable resistive devices represented by a ReRAM (Resistive Random Access Memory) has been actively carried out. This nonvolatile variable resistive device is capable of a low-voltage operation, a high-speed switching, and scaling and is therefore a promising candidate as a next-generation large-capacity storage device to replace existing products such as a floating gate-type NAND flash memory. Specifically, for example, a nonvolatile variable resistive device in which amorphous silicon is used for a variable resistive layer is exemplified.

BRIEF DESCRIPTION OF THE DRAWINGS

FIG. 3A to FIG. 3C are cross-sectional views illustrating a forming process of conductive filaments at a time of writing of the nonvolatile variable resistive device according to the first embodiment;

FIG. 3D is a timing chart illustrating a pulse-voltage applying method at a time of writing of the nonvolatile variable resistive device according to the first embodiment;

FIG. 3E is a diagram illustrating a changing state of a resistance value at a time of writing of the nonvolatile variable resistive device according to the first embodiment;

FIG. 8A to FIG. 8C are cross-sectional views illustrating a forming process of conductive filaments at a time of writing of the nonvolatile variable resistive device according to the fifth embodiment;

FIG. 8D is a timing chart illustrating a pulse-voltage applying method at a time of writing of the nonvolatile variable resistive device according to the fifth embodiment;

FIG. 8E is a diagram illustrating a changing state of a resistance value at a time of writing of the nonvolatile variable resistive device according to the fifth embodiment;

FIG. 9A to FIG. 9C are cross-sectional views illustrating a forming process of conductive filaments at a time of erasing of the nonvolatile variable resistive device according to the fifth embodiment;

FIG. 9D is a timing chart illustrating a pulse-voltage applying method at a time of erasing of the nonvolatile variable resistive device according to the fifth embodiment;

FIG. 9E is a diagram illustrating a changing state of a resistance value at a time of erasing of the nonvolatile variable resistive device according to the fifth embodiment;

FIG. 13A to FIG. 13C are cross-sectional views illustrating a forming process of conductive filaments at a time of erasing of the nonvolatile variable resistive device according to the seventh embodiment;

FIG. 13D is a timing chart illustrating a pulse-voltage applying method at a time of erasing of the nonvolatile variable resistive device according to the seventh embodiment;

FIG. 13E is a diagram illustrating a changing state of a resistance value at a time of erasing of the nonvolatile variable resistive device according to the seventh embodiment;

DETAILED DESCRIPTION

In general, according to a nonvolatile variable resistive device of embodiments, a first electrode, a second electrode, a third electrode, a first variable resistive layer, and a second variable resistive layer are provided. The first electrode includes a metal element. The second electrode includes a semiconductor element. The third electrode includes a metal element. The first variable resistive layer is arranged between the first electrode and the second electrode and is capable of reversibly changing a resistance by filament formation and dissolution of the metal element of the first electrode. The second variable resistive layer is arranged between the second electrode and the third electrode and is capable of reversibly changing a resistance by filament formation and dissolution of the metal element of the third electrode.

The nonvolatile variable resistive device according to the embodiments will be explained below with reference to the drawings. The present invention is not limited to these embodiments.

(First Embodiment)

Figure 1:
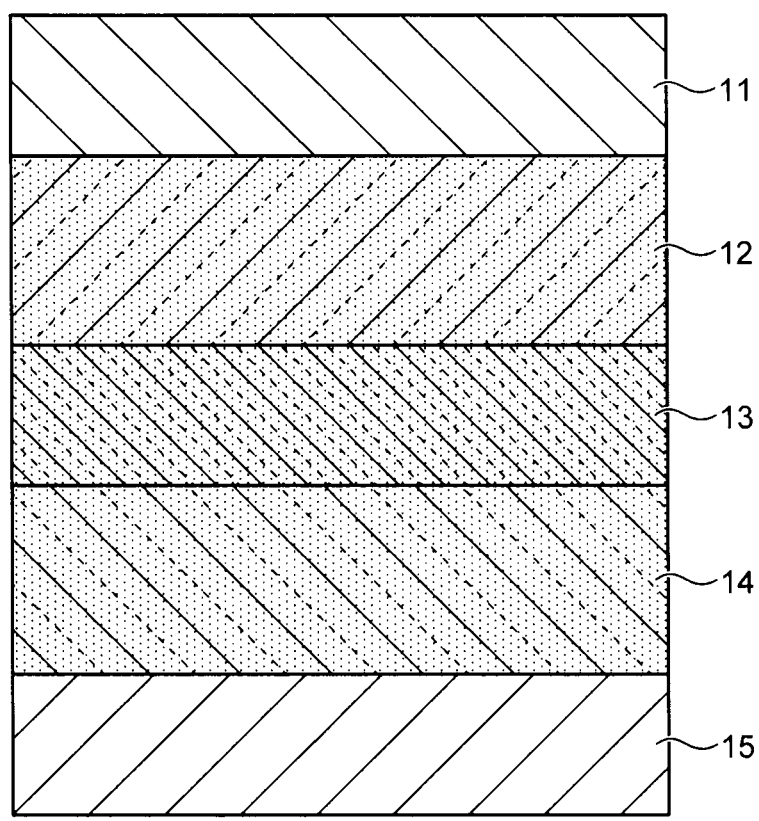
FIG. 1 is a cross-sectional view illustrating a schematic configuration of a nonvolatile variable resistive device according to a first embodiment.

FIG. 1 is a cross-sectional view illustrating a schematic configuration of a nonvolatile variable resistive device according to the first embodiment.

In FIG. 1, a first variable resistive layer 12 is arranged between a first electrode 11 and a second electrode 13, and a second variable resistive layer 14 is arranged between the second electrode 13 and a third electrode 15.

The first electrode 11 and the third electrode 15 include metal elements and the metal element of the first electrode 11 and the metal element of the third electrode 15 can be made different from each other. For example, the metal element of the first electrode 11 and the metal element of the third electrode 15 can be selected so that at least any one of a diffusion rate, an ionization energy, and a cohesive energy in the first variable resistive layer 12 or the second variable resistive layer 14 is different from each other.

As the first electrode 11 and the third electrode 15, Ag, Au, Ti, Ni, Co, Al, Fe, Cr, Cu, W, Hf, Ta, Pt, Ru, Zr, or Ir, nitride or carbide thereof, a chalcogenide material, or the like can be used. Moreover, an alloy material including a plurality of such metal or semiconductor elements may be used as the first electrode 11 and the third electrode 15.

For example, when Si is the main component of the first variable resistive layer 12 and the second variable resistive layer 14, a metal material which can be applied to the first electrode 11 and the third electrode 15 and whose diffusion rate in Si is high includes Ag, Cu, Ni, Fe, Ru, Cr, Ir, Au, Pt, Co, and the like. A metal material whose diffusion rate in Si is low includes Ti, Hf, Zr, Ta, Al, W, and the like. Metal whose cohesive energy is low, for example, includes Ag and Al and metal whose cohesive energy is high, for example, includes Ni and Co.

The second electrode 13 includes a semiconductor element and, for example, a semiconductor layer doped with an impurity can be used. For example, when Si is the main component of the first variable resistive layer 12 and the second variable resistive layer 14, doped silicon can be used for the second electrode 13. This doped silicon can be formed by activating an Si layer, into which boron, arsenic, or phosphorus is implanted at a high concentration, by a heat treatment. The sheet resistance of this doped silicon can be set, for example, equal to or lower than $3 \times 10^3 \Omega/\square$. The second electrode 13 may be amorphous semiconductor, polycrystalline semiconductor, or single-crystal semiconductor.

The first variable resistive layer 12 and the second variable resistive layer 14 include a semiconductor element, and this semiconductor element can be selected, for example, from among Si, Ge, SiGe, GaAs, InP, GaP, GaInAsP, GaN, SiC, and the like. The first variable resistive layer 12 and the second variable resistive layer 14 may be amorphous semiconductor, polycrystalline semiconductor, or single-crystal semiconductor. N or O may be added to the semiconductor element and, for example, SiN or $SiO_2$ may be used. The first variable resistive layer 12 and the second variable resistive layer 14 may be composed of the same semiconductor element. The film thickness of the first variable resistive layer 12 and the second variable resistive layer 14 is typically 1 nm to 300 nm. The film thickness is preferably as small as possible considering the scaling of the device, however, if the film thickness is too small, a homogeneous film cannot be formed, so that the film thickness is more preferably 2 nm to 20 nm.

The first variable resistive layer 12 can reversibly change the resistance by filament formation and dissolution of the metal element of the first electrode 11. The second variable resistive layer 14 can reversibly change the resistance by filament formation and dissolution of the metal element of the third electrode 15.

Specifically, in the first variable resistive layer 12, a conductive filament is formed of the metal element supplied from the first electrode 11, so that the first variable resistive layer 12 changes from a high resistance state to a low resistance state. The metal element of the conductive filament formed in the first variable resistive layer 12 is recovered in the first electrode 11 and the conductive filament formed in the first variable resistive layer 12 disappears, so that the first variable resistive layer 12 changes from a low resistance state to a high resistance state.

Moreover, in the second variable resistive layer 14, a conductive filament is formed of the metal element supplied from the third electrode 15, so that the second variable resistive layer 14 changes from a high resistance state to a low resistance state. The metal element of the conductive filament formed in the second variable resistive layer 14 is recovered in the third electrode 15 and the conductive filament formed in the second variable resistive layer 14 disappears, so that the second variable resistive layer 14 changes from a low resistance state to a high resistance state.

The metal element of the first electrode 11 and the metal element of the third electrode 15 are made different from each other, so that it is possible to make the drive voltage applied between the first electrode 11 and the third electrode 15 when a conductive filament is formed in the first variable resistive layer 12 and the drive voltage applied between the first electrode 11 and the third electrode 15 when a conductive filament is formed in the second variable resistive layer 14 different from each other.

Therefore, the resistance of the nonvolatile variable resistive device can be changed in stages, so that a multi-level nonvolatile variable resistive device can be realized while increasing tolerance of the resistance value of the nonvolatile variable resistive device.

Moreover, the second electrode 13 is arranged between the first variable resistive layer 12 and the second variable resistive layer 14, so that it is possible to make the polarities of the drive voltages different from each other between when a conductive filament is formed in the first variable resistive layer 12 and when a conductive filament is formed in the second variable resistive layer 14. Therefore, when forming a conductive filament in one of the first variable resistive layer 12 and the second variable resistive layer 14, a conductive filament can be prevented from being formed easily in the other thereof, enabling to improve the controllability of the setting.

Furthermore, the second electrode 13 is arranged between the first variable resistive layer 12 and the second variable resistive layer 14, so that conductive filaments can be formed in the first variable resistive layer 12 and the second variable resistive layer 14 to come into contact with the second electrode 13. Therefore, holes or electrons can be sufficiently supplied to both the conductive filaments from the second electrode 13, enabling to improve the controllability of the resetting.

Figure 2A:
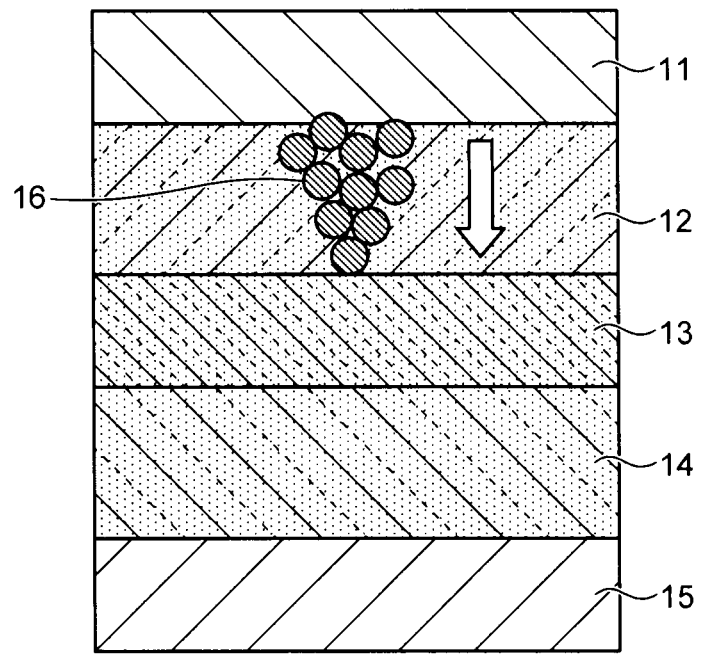
FIG. 2A is a cross-sectional view illustrating a first on-state of the nonvolatile variable resistive device according to the first embodiment.
Figure 2B:
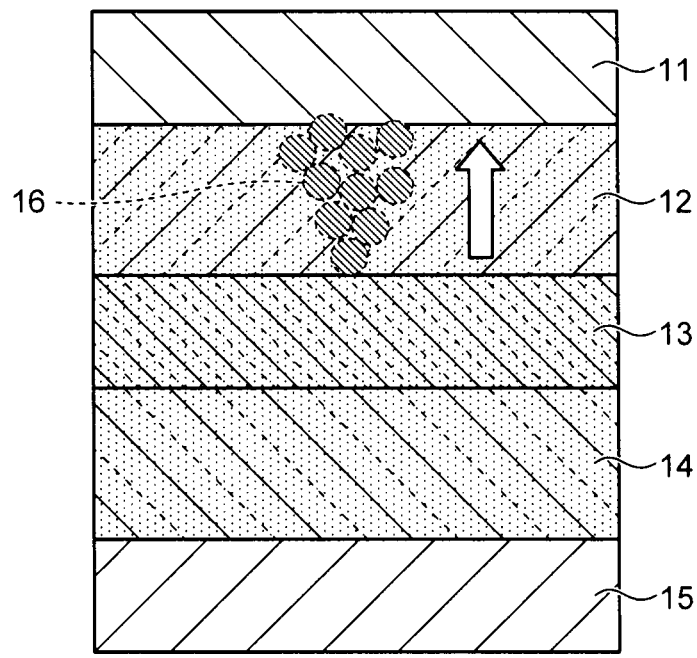
FIG. 2B is a cross-sectional view illustrating an off-state of the nonvolatile variable resistive device according to the first embodiment.

FIG. 2A is a cross-sectional view illustrating a first on-state of the nonvolatile variable resistive device according to the first embodiment and FIG. 2B is a cross-sectional view illustrating an off-state of the nonvolatile variable resistive device according to the first embodiment.

In FIG. 2A, if the nonvolatile variable resistive device is in the state in FIG. 1, when a voltage that is positive with respect to the third electrode 15 is applied to the first electrode 11, the metal element of the first electrode 11 is ionized and the metal ions diffuse in the first variable resistive layer 12, and electrons are supplied to the first variable resistive layer 12 via the second electrode 13. Then, in the first variable resistive layer 12, the metal ions and the electrons are combined, so that a conductive filament 16 formed of the metal element of the first electrode 11 is formed. Therefore, the first variable resistive layer 12 is set to a low resistance state.

When a voltage that is negative with respect to the third electrode 15 is applied to the first electrode 11 from the state in FIG. 2A, as shown in FIG. 2B, holes are supplied to the first variable resistive layer 12 via the second electrode 13, so that the metal element of the conductive filament 16 is ionized in the first variable resistive layer 12. Then, the metal ions are recovered in the first electrode 11 and the conductive filament 16 is made to disappear in the first variable resistive layer 12, so that the first variable resistive layer 12 is reset to a high resistance state.

When a voltage that is positive with respect to the third electrode 15 is applied to the first electrode 11 again from the state in FIG. 2B, as shown in FIG. 2A, the conductive filament 16 is formed in the first variable resistive layer 12 again. In other words, the state in FIG. 2A and the state in FIG. 2B are reversibly controllable. These two states are made to correspond to an on-state and an off-state, respectively, so that a binary nonvolatile variable resistive memory can be realized.

Next, the method of multi-leveling the nonvolatile variable resistive device is explained.

As described above, the first electrode 11 and the third electrode 15 include metal elements that are different in a diffusion rate, an ionization energy, or a cohesive energy in the first variable resistive layer 12 and the second variable resistive layer 14, so that the drive voltages, at which conductive filaments are formed in the first variable resistive layer 12 and the second variable resistive layer 14, are different from each other. A multi-level nonvolatile variable resistive device can be realized by using this difference in the drive voltage.

FIG. 3A to FIG. 3C are cross-sectional views illustrating a forming process of conductive filaments at a time of writing of the nonvolatile variable resistive device according to the first embodiment, FIG. 3D is a timing chart illustrating a pulse-voltage applying method at a time of writing of the nonvolatile variable resistive device according to the first embodiment, and FIG. 3E is a diagram illustrating a changing state of a resistance value at a time of writing of the nonvolatile variable resistive device according to the first embodiment.

In the following explanation, the metal element of the first electrode 11 has a higher ionization energy, a lower diffusion rate in silicon, or a higher cohesive energy than the metal element of the third electrode 15. In this case, the absolute value of a drive voltage V1 when the conductive filament 16 is formed in the first variable resistive layer 12 becomes larger than the absolute value of a drive voltage V2 when a conductive filament 17 is formed in the second variable resistive layer 14.

In FIG. 3A, when the conductive filaments 16 and 17 are not formed in the first variable resistive layer 12 and the second variable resistive layer 14, respectively, the first variable resistive layer 12 and the second variable resistive layer 14 are in a high resistance state and the resistance value of this nonvolatile variable resistive device becomes R0.

When a first set pulse voltage Ps1 of the drive voltage V1 that is positive with respect to the third electrode 15 is applied to the first electrode 11 from the state in FIG. 3A, the metal element of the first electrode 11 is ionized and the metal ions diffuse in the first variable resistive layer 12, and electrons are supplied to the first variable resistive layer 12 via the second electrode 13. Then, in the first variable resistive layer 12, the metal ions and the electrons are combined, so that, as shown in FIG. 3B, the conductive filament 16 formed of the metal element of the first electrode 11 is formed, whereby the first variable resistive layer 12 is set to a low resistance state. At this time, the first variable resistive layer 12 is in a low resistance state and the second variable resistive layer 14 is in a high resistance state, and the resistance value of this nonvolatile variable resistive device becomes R1 that satisfies R0>R1.

When a second set pulse voltage Ps2 of the drive voltage V2 that is negative with respect to the third electrode 15 is applied to the first electrode 11 from the state in FIG. 3B, the metal element of the third electrode 15 is ionized and the metal ions diffuse in the second variable resistive layer 14, and electrons are supplied to the second variable resistive layer 14 via the second electrode 13. Then, in the second variable resistive layer 14, the metal ions and the electrons are combined, so that the conductive filament 17 formed of the metal element of the third electrode 15 is formed, whereby the second variable resistive layer 14 is set to a low resistance state. At this time, the first variable resistive layer 12 and the second variable resistive layer 14 are in a low resistance state and the resistance value of this nonvolatile variable resistive device becomes R2 that satisfies R0>R1>R2.

Consequently, the resistance value of the nonvolatile variable resistive device can be changed in three stages, so that a three-level nonvolatile variable resistive device can be realized. Moreover, the resistance values R0, R1, and R2 of this nonvolatile variable resistive device can take discrete values, so that the tolerance of the resistance values R0, R1, and R2 can be increased. Therefore, even when the resistance values R0, R1, and R2 vary, erroneous reading of data can be reduced.

Moreover, it is possible to make the polarity of the electric field applied to the first variable resistive layer 12 opposite between when the conductive filament 16 is formed in the first variable resistive layer 12 and when the conductive filament 17 is formed in the second variable resistive layer 14. Therefore, when forming the conductive filament 16 in the first variable resistive layer 12, the conductive filament 17 can be prevented from being formed in the second variable resistive layer 14, enabling to improve the property of changing the resistance in stages in the nonvolatile variable resistive device.

When the conductive filament 17 in the second variable resistive layer 14 is formed, the electric field is applied to the first variable resistive layer 12 in a direction in which the conductive filament 16 in FIG. 3C is made to disappear. Therefore, it is needed to select the metal elements of the first electrode 11 and the third electrode 15 so that the condition of |Vi|>|V2| is satisfied, in which Vi is a drive voltage when resetting the conductive filament 16 in FIG. 3C.

Figure 4A:
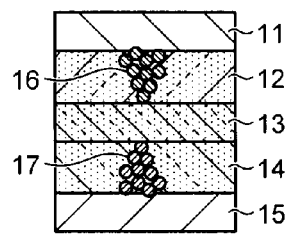
FIG. 4A to FIG. 4C are cross-sectional views illustrating a forming process of conductive filaments at a time of erasing of the nonvolatile variable resistive device according to the first embodiment.
Figure 4B:
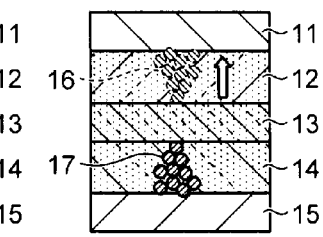
Figure 4C:
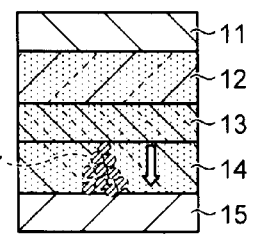
Figure 4D:
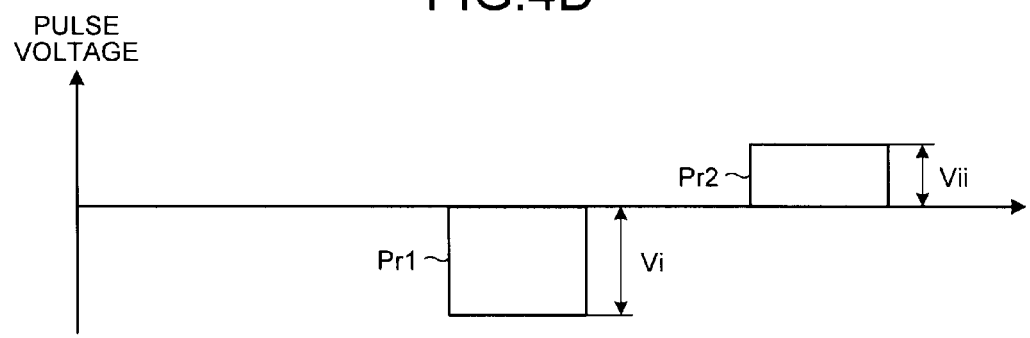
FIG. 4D is a timing chart illustrating a pulse-voltage applying method at a time of erasing of the nonvolatile variable resistive device according to the first embodiment.
Figure 4E:
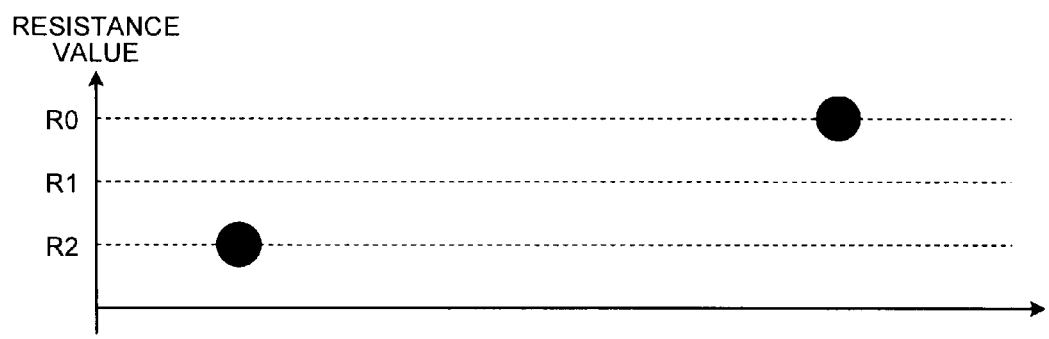
FIG. 4E is a diagram illustrating a changing state of a resistance value at a time of erasing of the nonvolatile variable resistive device according to the first embodiment.

FIG. 4A to FIG. 4C are cross-sectional views illustrating a forming process of conductive filaments at a time of erasing of the nonvolatile variable resistive device according to the first embodiment, FIG. 4D is a timing chart illustrating a pulse-voltage applying method at a time of erasing of the nonvolatile variable resistive device according to the first embodiment, and FIG. 4E is a diagram illustrating a changing state of a resistance value at a time of erasing of the nonvolatile variable resistive device according to the first embodiment.

When a first reset pulse voltage Pr1 of the drive voltage V1 that is negative with respect to the third electrode 15 is applied to the first electrode 11 from the state in FIG. 4A, holes are supplied to the first variable resistive layer 12 via the second electrode 13, so that the metal element of the conductive filament 16 is ionized in the first variable resistive layer 12. Then, as shown in FIG. 4B, the metal ions are recovered in the first electrode 11 and the conductive filament 16 is made to disappear in the first variable resistive layer 12, so that the first variable resistive layer 12 is reset to a high resistance state.

When a second reset pulse voltage Pr2 of a drive voltage Vii that is positive with respect to the third electrode 15 is applied to the first electrode 11 from the state in FIG. 4B, holes are supplied to the second variable resistive layer 14 via the second electrode 13, so that the metal element of the conductive filament 17 is ionized in the second variable resistive layer 14. Then, as shown in FIG. 4C, the metal ions are recovered in the third electrode 15 and the conductive filament 17 is made to disappear in the second variable resistive layer 14, so that the second variable resistive layer 14 is reset to a high resistance state.

The second electrode 13 is arranged between the first variable resistive layer 12 and the second variable resistive layer 14, so that holes can be supplied to the conductive filaments 16 and 17 from the second electrode 13, enabling to improve the controllability of the resetting.

When causing the conductive filament 17 to disappear from the second variable resistive layer 14, the electric field is applied to the first variable resistive layer 12 in a direction in which the conductive filament 16 is formed. Therefore, it is needed to select the metal elements of the first electrode 11 and the third electrode 15 so that the condition of |V1|>|Vii| is satisfied, in which Vii is a drive voltage when resetting the conductive filament 17 in FIG. 4C.

(Second Embodiment)

Next, the manufacturing method of the nonvolatile variable resistive device in FIG. 1 is explained. In this second embodiment, the case is explained as an example in which, in FIG. 1, Ni is used as the first electrode 11, Ag is used as the third electrode 15, p-type Si is used as the second electrode 13, and amorphous silicon is used as the first variable resistive layer 12 and the second variable resistive layer 14.

In FIG. 1, Ag to be the third electrode 15 is deposited on a silicon single-crystal substrate by a method such as sputtering.

Next, amorphous silicon is deposited as the second variable resistive layer 14 on the third electrode 15, for example, by the Chemical Vapor Deposition (CVD) method.

Next, a doped silicon layer is formed as the second electrode 13 on the second variable resistive layer 14. In the forming method of this doped silicon layer, when the second variable resistive layer 14 is silicon, the second variable resistive layer 14 can be delta doped with boron B at a high concentration and activated. In order to suppress diffusion of boron B in the subsequent process, the Co-Implantation of implanting carbon C or the like together with boron B may be performed. Alternatively, a diffusion barrier layer, such as $SiO_2$, may be inserted at the interface between the second variable resistive layer 14 and the second electrode 13. Still alternatively, a doped germanium layer may be formed by implanting boron B into a Ge layer at a high concentration after depositing the Ge layer.

Next, amorphous silicon is deposited as the first variable resistive layer 12 on the second electrode 13, for example, by the CVD method.

Next, Ni to be the first electrode 11 is deposited on the first variable resistive layer 12 by a method such as sputtering.

Because Ni has a cohesive energy higher than Ag, the drive voltage when the conductive filament 16 is formed in the first variable resistive layer 12 can be made higher than the drive voltage when the conductive filament 17 is formed in the second variable resistive layer 14. Therefore, the resistance of the nonvolatile variable resistive device can be changed in stages, so that a multi-level nonvolatile variable resistive device can be realized while increasing tolerance of the resistance value of the nonvolatile variable resistive device.

(Third Embodiment)

Figure 5:
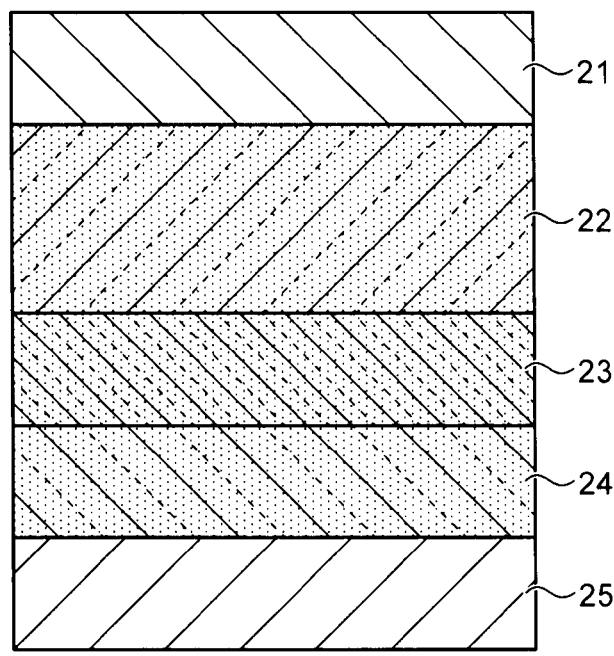
FIG. 5 is a cross-sectional view illustrating a schematic configuration of a nonvolatile variable resistive device according to a third embodiment.

FIG. 5 is a cross-sectional view illustrating a schematic configuration of a nonvolatile variable resistive device according to the third embodiment.

In FIG. 5, a first variable resistive layer 22 is arranged between a first electrode 21 and a second electrode 23, and a second variable resistive layer 24 is arranged between the second electrode 23 and a third electrode 25.

The first electrode 21 and the third electrode 25 include metal elements and the metal element of the first electrode 21 and the metal element of the third electrode 25 can be the same. As the first electrode 21 and the third electrode 25, Ag, Au, Ti, Ni, Co, Al, Fe, Cr, Cu, W, Hf, Ta, Pt, Ru, Zr, or Ir, nitride or carbide thereof, a chalcogenide material, or the like can be used. Moreover, an alloy material including a plurality of such metal or semiconductor elements may be used as the first electrode 21 and the third electrode 25.

The second electrode 23 includes a semiconductor element and, for example, a semiconductor layer doped with an impurity can be used. For example, when Si is the main component of the first variable resistive layer 22 and the second variable resistive layer 24, doped silicon can be used for the third electrode 25. This doped silicon can be formed by activating an Si layer, into which boron is implanted at a high concentration, by a heat treatment. The sheet resistance of this doped silicon can be set, for example, equal to or lower than $3 \times 10^3 \Omega/\square$. The second electrode 23 may be amorphous semiconductor, polycrystalline semiconductor, or single-crystal semiconductor.

The first variable resistive layer 22 and the second variable resistive layer 24 include a semiconductor element, and this semiconductor element can be selected, for example, from among Si, Ge, SiGe, GaAs, InP, GaP, GaInAsP, GaN, SiC, and the like. The first variable resistive layer 22 and the second variable resistive layer 24 may be amorphous semiconductor, polycrystalline semiconductor, or single-crystal semiconductor. N or O may be added to the semiconductor element and, for example, SiN or $SiO_2$ may be used. The first variable resistive layer 22 and the second variable resistive layer 24 may be composed of the same semiconductor element. The film thicknesses of the first variable resistive layer 22 and the second variable resistive layer 24 can be set to be different from each other, and, in FIG. 5, a case is illustrated in which the first variable resistive layer 22 has a larger film thickness than the second variable resistive layer 24. The film thickness of the first variable resistive layer 22 and the second variable resistive layer 24 is typically 1 nm to 300 nm. The film thickness is preferably as small as possible considering the scaling of the element, however, if the film thickness is too small, a homogeneous film cannot be formed, so that the film thickness is more preferably 2 nm to 20 nm.

The first variable resistive layer 22 can reversibly change the resistance by filament formation and dissolution of the metal element of the first electrode 21. The second variable resistive layer 24 can reversibly change the resistance by entry and exit of the metal element of the third electrode 25.

Specifically, in the first variable resistive layer 22, a conductive filament is formed of the metal element supplied from the first electrode 21, so that the first variable resistive layer 22 changes from a high resistance state to a low resistance state. The metal element of the conductive filament formed in the first variable resistive layer 22 is recovered in the first electrode 21 and the conductive filament formed in the first variable resistive layer 22 disappears, so that the first variable resistive layer 22 changes from a low resistance state to a high resistance state.

Moreover, in the second variable resistive layer 24, a conductive filament is formed of the metal element supplied from the third electrode 25, so that the second variable resistive layer 24 changes from a high resistance state to a low resistance state. The metal element of the conductive filament formed in the second variable resistive layer 24 is recovered in the third electrode 25 and the conductive filament formed in the second variable resistive layer 24 disappears, so that the second variable resistive layer 24 changes from a low resistance state to a high resistance state.

The first variable resistive layer 22 and the second variable resistive layer 24 are made different from each other in film thickness, so that the drive voltage applied between the first electrode 21 and the third electrode 25 when a conductive filament is formed in the first variable resistive layer 22 and the drive voltage applied between the first electrode 21 and the third electrode 25 when a conductive filament is formed in the second variable resistive layer 24 can be made different from each other.

Therefore, the resistance of the nonvolatile variable resistive device can be changed in stages, so that a multi-level nonvolatile variable resistive device can be realized while increasing tolerance of the resistance value of the nonvolatile variable resistive device.

Moreover, the second electrode 23 is arranged between the first variable resistive layer 22 and the second variable resistive layer 24, so that it is possible to make the polarities of the drive voltages different from each other between when a conductive filament is formed in the first variable resistive layer 22 and when a conductive filament is formed in the second variable resistive layer 24. Therefore, when a conductive filament in one of the first variable resistive layer 22 and the second variable resistive layer 24 is formed, a conductive filament can be prevented from being formed easily in the other thereof, enabling to improve the controllability of the setting.

Furthermore, the second electrode 23 is arranged between the first variable resistive layer 22 and the second variable resistive layer 24, so that conductive filaments can be formed in the first variable resistive layer 22 and the second variable resistive layer 24 to come into contact with the second electrode 23. Therefore, holes or electrons can be sufficiently supplied to both the conductive filaments from the second electrode 23, enabling to improve the controllability of the resetting.

(Fourth Embodiment)

Next, the manufacturing method of the nonvolatile variable resistive device in FIG. 5 is explained.

In this fourth embodiment, the case is explained as an example in which, in FIG. 5, Ag is used as the first electrode 21 and the third electrode 25, p-type Si is used as the second electrode 23, and amorphous silicon is used as the first variable resistive layer 22 and the second variable resistive layer 24.

In FIG. 5, Ag to be the third electrode 25 is deposited on a silicon single-crystal substrate by a method such as sputtering.

Next, amorphous silicon is deposited as the second variable resistive layer 24 on the third electrode 25, for example, by the CVD method.

Next, a doped silicon layer is formed as the second electrode 23 on the second variable resistive layer 24. In the forming method of this doped silicon layer, when the second variable resistive layer 24 is silicon, the second variable resistive layer 24 can be delta doped with boron B at a high concentration and activated. In order to suppress diffusion of boron B in the subsequent process, the Co-Implantation of implanting carbon C or the like together with boron B may be performed. Alternatively, a diffusion barrier layer, such as $SiO_2$, may be inserted at the interface between the second variable resistive layer 24 and the second electrode 23. Still alternatively, a doped germanium layer may be formed by implanting boron B into a Ge layer at a high concentration after depositing the Ge layer.

Next, amorphous silicon is deposited as the first variable resistive layer 22 on the second electrode 23, for example, by the CVD method. At this time, amorphous silicon is deposited so that the second variable resistive layer 24 becomes smaller in film thickness than the first variable resistive layer 22.

Next, Ag to be the first electrode 21 is deposited on the first variable resistive layer 22 by a method such as sputtering.

Because the first variable resistive layer 22 is larger in the film thickness than the second variable resistive layer 24, the drive voltage when a conductive filament is formed in the first variable resistive layer 22 can be made higher than the drive voltage when a conductive filament is formed in the second variable resistive layer 24. Therefore, the resistance of the nonvolatile variable resistive device can be changed in stages, so that a multi-level nonvolatile variable resistive device can be realized while increasing tolerance of the resistance value of the nonvolatile variable resistive device.

(Fifth Embodiment)

Figure 6:
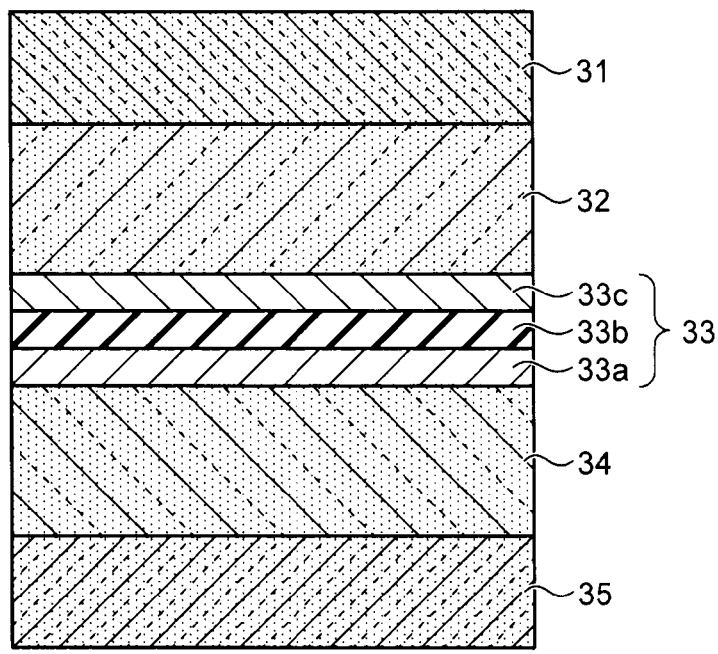
FIG. 6 is a cross-sectional view illustrating a schematic configuration of a nonvolatile variable resistive device according to a fifth embodiment.

FIG. 6 is a cross-sectional view illustrating a schematic configuration of a nonvolatile variable resistive device according to the fifth embodiment.

In FIG. 6, a first variable resistive layer 32 is arranged between a first electrode 31 and a second electrode 33 and a second variable resistive layer 34 is arranged between the second electrode 33 and a third electrode 35.

In the second electrode 33, a lower electrode 33a and an upper electrode 33c are provided and a diffusion barrier layer 33b is provided between the lower electrode 33a and the upper electrode 33c. The lower electrode 33a and the upper electrode 33c include metal elements and the metal element of the lower electrode 33a and the metal element of the upper electrode 33c can be made different from each other. For example, the metal element of the lower electrode 33a and the metal element of the upper electrode 33c can be selected so that at least any one of a diffusion rate, an ionization energy, and a cohesive energy in the first variable resistive layer 32 or the second variable resistive layer 34 is different from each other.

As the lower electrode 33a and the upper electrode 33c, Ag, Au, Ti, Ni, Co, Al, Fe, Cr, Cu, W, Hf, Ta, Pt, Ru, Zr, or Ir, nitride or carbide thereof, a chalcogenide material, or the like can be used. Moreover, an alloy material including a plurality of such metal or semiconductor elements may be used as the lower electrode 33a and the upper electrode 33c.

For example, when Si is the main component of the first variable resistive layer 32 and the second variable resistive layer 34, a metal material which can be applied to the lower electrode 33a and the upper electrode 33c and whose diffusion rate in Si is high includes Ag, Cu, Ni, Fe, Ru, Cr, Ir, Au, Pt, Co, and the like. A metal material whose diffusion rate in Si is low includes Ti, Hf, Zr, Ta, Al, W, and the like. Metal whose cohesive energy is low, for example, includes Ag and Al and metal whose cohesive energy is high, for example, includes Ni and Co.

The diffusion barrier layer 33b can be formed of a material whose dielectric constant is different from amorphous silicon or polysilicon used as the first variable resistive layer 32 and the second variable resistive layer 34 or a material whose diffusion rate of metal is low such as oxide, nitride, boride, or oxynitride of Ti, Zr, Ta, W, or Si. For example, as a material whose dielectric constant is higher than amorphous silicon or polysilicon, $Ta_2O_5$, $La_2O_3$, $HfO_2$, $ZrO_2$, $ZrAl_xO_y$, $HfAl_xO_y$, or the like can be used. As a material whose dielectric constant is lower than amorphous silicon or polysilicon, $SiO_2$, $Si_3N_4$, $Al_2O_3$, or the like can be used.

For example, as the diffusion barrier layer 33b, an $SiO_2$ film whose dielectric constant is lower than the first variable resistive layer 32 and the second variable resistive layer 34 can be used. The diffusion barrier layer 33b preferably has a thickness of 100 nm or less. The resistance value increases in some cases by interposing the diffusion barrier layer 33b between the lower electrode 33a and the upper electrode 33c, however, the resistance value of the nonvolatile variable resistive device can be suppressed by setting the thickness of the diffusion barrier layer 33b to 100 nm or less.

The first electrode 31 and the third electrode 35 include a semiconductor element and, for example, a semiconductor layer doped with an impurity can be used. For example, when Si is the main component of the first variable resistive layer 32 and the second variable resistive layer 34, doped silicon can be used for the first electrode 31 and the third electrode 35. This doped silicon can be formed by activating an Si layer, into which boron is implanted at a high concentration, by a heat treatment. The sheet resistance of this doped silicon can be set, for example, equal to or lower than $3\times10^3 \Omega/\square$. The first electrode 31 and the third electrode 35 may be amorphous semiconductor, polycrystalline semiconductor, or single-crystal semiconductor.

The first variable resistive layer 32 and the second variable resistive layer 34 include a semiconductor element, and this semiconductor element can be selected, for example, from among Si, Ge, SiGe, GaAs, InP, GaP, GaInAsP, GaN, SiC, and the like. The first variable resistive layer 32 and the second variable resistive layer 34 may be amorphous semiconductor, polycrystalline semiconductor, or single-crystal semiconductor. N or O may be added to the semiconductor element and, for example, SiN or $SiO_2$ may be used. The first variable resistive layer 32 and the second variable resistive layer 34 may be composed of the same semiconductor element. The film thickness of the first variable resistive layer 32 and the second variable resistive layer 34 is typically 1 nm to 300 nm. The film thickness is preferably as small as possible considering the scaling of the element, however, if the film thickness is too small, a homogeneous film cannot be formed, so that the film thickness is more preferably 2 nm to 20 nm.

The first variable resistive layer 32 can reversibly change the resistance by filament formation and dissolution of the metal element of the upper electrode 33c. The second variable resistive layer 34 can reversibly change the resistance by filament formation and dissolution of the metal element of the lower electrode 33a.

Specifically, in the first variable resistive layer 32, a conductive filament is formed of the metal element supplied from the upper electrode 33c, so that the first variable resistive layer 32 changes from a high resistance state to a low resistance state. The metal element of the conductive filament formed in the first variable resistive layer 32 is recovered in the upper electrode 33c and the conductive filament formed in the first variable resistive layer 32 disappears, so that the first variable resistive layer 32 changes from a low resistance state to a high resistance state.

Moreover, in the second variable resistive layer 34, a conductive filament is formed of the metal element supplied from the lower electrode 33a, so that the second variable resistive layer 34 changes from a high resistance state to a low resistance state. The metal element of the conductive filament formed in the second variable resistive layer 34 is recovered in the lower electrode 33a and the conductive filament formed in the second variable resistive layer 34 disappears, so that the second variable resistive layer 34 changes from a low resistance state to a high resistance state.

The metal element of the lower electrode 33a and the metal element of the upper electrode 33c are made different from each other, so that it is possible to make the drive voltage applied between the first electrode 31 and the third electrode 35 when a conductive filament is formed in the first variable resistive layer 32 and the drive voltage applied between the first electrode 31 and the third electrode 35 when a conductive filament is formed in the second variable resistive layer 34 different from each other.

Therefore, the resistance of the nonvolatile variable resistive device can be changed in stages, so that a multi-level nonvolatile variable resistive device can be realized while increasing tolerance of the resistance value of the nonvolatile variable resistive device.

Moreover, the first electrode 31 is arranged on the upper surface side of the first variable resistive layer 32 and the third electrode 35 is arranged on the lower surface side of the second variable resistive layer 34, so that it is possible to make the polarities of the drive voltages different from each other between when a conductive filament is formed in the first variable resistive layer 32 and when a conductive filament is formed in the second variable resistive layer 34. Therefore, when a conductive filament in one of the first variable resistive layer 32 and the second variable resistive layer 34 is formed, a conductive filament can be prevented from being formed easily in the other thereof, enabling to improve the controllability of the setting.

Furthermore, the first electrode 31 is arranged on the upper surface side of the first variable resistive layer 32 and the third electrode 35 is arranged on the lower surface side of the second variable resistive layer 34, so that a conductive filament can be formed in the first variable resistive layer 32 to come into contact with the first electrode 31 and a conductive filament can be formed in the second variable resistive layer 34 to come into contact with the third electrode 35. Therefore, holes or electrons can be sufficiently supplied to both the conductive filaments from the first electrode 31 or the third electrode 35, enabling to improve the controllability of the resetting.

Figure 7A:
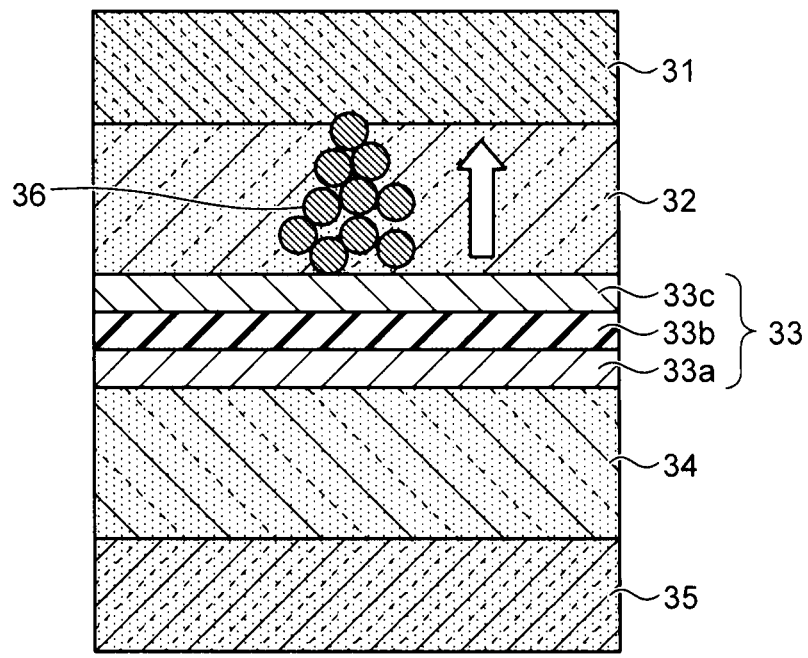
FIG. 7A is a cross-sectional view illustrating a first on-state of the nonvolatile variable resistive device according to the fifth embodiment.
Figure 7B:
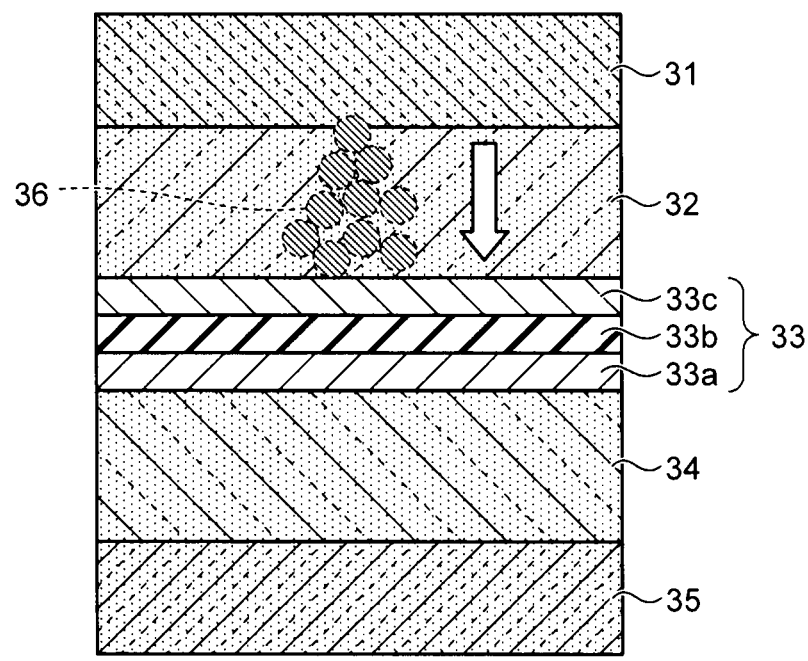
FIG. 7B is a cross-sectional view illustrating an off-state of the nonvolatile variable resistive device according to the fifth embodiment.

FIG. 7A is a cross-sectional view illustrating a first on-state of the nonvolatile variable resistive device according to the fifth embodiment and FIG. 7B is a cross-sectional view illustrating an off-state of the nonvolatile variable resistive device according to the fifth embodiment.

In FIG. 7A, if the nonvolatile variable resistive device is in the state in FIG. 6, when a voltage that is negative with respect to the third electrode 35 is applied to the first electrode 31, the metal element of the upper electrode 33c is ionized and the metal ions diffuse in the first variable resistive layer 32, and electrons are supplied to the first variable resistive layer 32 via the first electrode 31. Then, in the first variable resistive layer 32, the metal ions and the electrons are combined, so that a conductive filament 36 formed of the metal element of the upper electrode 33c is formed. Therefore, the first variable resistive layer 32 is set to a low resistance state.

When a voltage that is positive with respect to the third electrode 35 is applied to the first electrode 31 from the state in FIG. 7A, as shown in FIG. 7B, holes are supplied to the first variable resistive layer 32 via the first electrode 31, so that the metal element of the conductive filament 36 is ionized in the first variable resistive layer 32. Then, the metal ions are recovered in the upper electrode 33c and the conductive filament 36 is made to disappear in the first variable resistive layer 32, so that the first variable resistive layer 32 is reset to a high resistance state.

When a voltage that is negative with respect to the third electrode 35 is applied to the first electrode 31 again from the state in FIG. 7B, as shown in FIG. 7A, the conductive filament 36 is formed in the first variable resistive layer 32 again. In other words, the state in FIG. 7A and the state in FIG. 7B are reversibly controllable. These two states are made to correspond to an on-state and an off-state, respectively, so that a binary nonvolatile variable resistive memory can be realized.

Next, the method of multi-leveling the nonvolatile variable resistive device is explained.

As described above, the lower electrode 33a and the upper electrode 33c include metal elements that are different in a diffusion rate, an ionization energy, or a cohesive energy in the first variable resistive layer 32 and the second variable resistive layer 34, so that the drive voltages, at which conductive filaments are formed in the first variable resistive layer 32 and the second variable resistive layer 34, are different from each other. A multi-level nonvolatile variable resistive device can be realized by using this difference in the drive voltage.

FIG. 8A to FIG. 8C are cross-sectional views illustrating a forming process of conductive filaments at a time of writing of the nonvolatile variable resistive device according to the fifth embodiment, FIG. 8D is a timing chart illustrating a pulse-voltage applying method at a time of writing of the nonvolatile variable resistive device according to the fifth embodiment, and FIG. 8E is a diagram illustrating a changing state of a resistance value at a time of writing of the nonvolatile variable resistive device according to the fifth embodiment.

In the following explanation, the metal element of the upper electrode 33c has a higher ionization energy, a lower diffusion rate in silicon, or a higher cohesive energy than the metal element of the lower electrode 33a. In this case, the absolute value of the drive voltage V1 when the conductive filament 36 is formed in the first variable resistive layer 32 becomes larger than the absolute value of the drive voltage V2 when a conductive filament 37 is formed in the second variable resistive layer 34.

In FIG. 8A, when the conductive filaments 36 and 37 are not formed in the first variable resistive layer 32 and the second variable resistive layer 34, respectively, the first variable resistive layer 32 and the second variable resistive layer 34 are in a high resistance state, and the resistance value of this nonvolatile variable resistive device becomes R0.

When a first set pulse voltage Ps11 of the drive voltage V1 that is negative with respect to the third electrode 35 is applied to the first electrode 31 from the state in FIG. 8A, the metal element of the upper electrode 33c is ionized and the metal ions diffuse in the first variable resistive layer 32, and electrons are supplied to the first variable resistive layer 32 via the first electrode 31. Then, in the first variable resistive layer 32, the metal ions and the electrons are combined, so that, as shown in FIG. 8B, the conductive filament 36 formed of the metal element of the upper electrode 33c is formed, whereby the first variable resistive layer 32 is set to a low resistance state. At this time, the first variable resistive layer 32 is in a low resistance state and the second variable resistive layer 34 is in a high resistance state, and the resistance value of this nonvolatile variable resistive device becomes R1 that satisfies R0>R1.

When a second set pulse voltage Ps12 of the drive voltage V2 that is positive with respect to the third electrode 35 is applied to the first electrode 31 from the state in FIG. 8B, the metal element of the lower electrode 33a is ionized and the metal ions diffuse in the second variable resistive layer 34, and electrons are supplied to the second variable resistive layer 34 via the third electrode 35. Then, in the second variable resistive layer 34, the metal ions and the electrons are combined, so that the conductive filament 37 formed of the metal element of the lower electrode 33a is formed, whereby the second variable resistive layer 34 is set to a low resistance state. At this time, the first variable resistive layer 32 and the second variable resistive layer 34 are in a low resistance state and the resistance value of this nonvolatile variable resistive device becomes R2 that satisfies R0>R1>R2.

Consequently, the resistance value of the nonvolatile variable resistive device can be changed in three stages, so that a three-level nonvolatile variable resistive device can be realized. Moreover, the resistance values R0, R1, and R2 of this nonvolatile variable resistive device can take discrete values, so that the tolerance of the resistance values R0, R1, and R2 can be increased. Therefore, even when the resistance values R0, R1, and R2 vary, erroneous reading of data can be reduced.

Moreover, it is possible to make the polarity of the electric field applied to the first variable resistive layer 32 opposite between when the conductive filament 36 is formed in the first variable resistive layer 32 and when the conductive filament 37 is formed in the second variable resistive layer 34. Therefore, when the conductive filament 36 in the first variable resistive layer 32 is formed, the conductive filament 37 can be prevented from being formed in the second variable resistive layer 34, enabling to improve the property of changing the resistance in stages in the nonvolatile variable resistive device.

When the conductive filament 37 in the second variable resistive layer 34 is formed, the electric field is applied to the first variable resistive layer 32 in a direction in which the conductive filament 36 in FIG. 8C is made to disappear. Therefore, it is needed to select the metal elements of the lower electrode 33a and the upper electrode 33c so that the condition of $|Vi|>|V2|$ is satisfied, in which Vi is a drive voltage when resetting the conductive filament 36 in FIG. 8C.

FIG. 9A to FIG. 9C are cross-sectional views illustrating a forming process of conductive filaments at a time of erasing of the nonvolatile variable resistive device according to the fifth embodiment, FIG. 9D is a timing chart illustrating a pulse-voltage applying method at a time of erasing of the nonvolatile variable resistive device according to the fifth embodiment, and FIG. 9E is a diagram illustrating a changing state of a resistance value at a time of erasing of the nonvolatile variable resistive device according to the fifth embodiment.

When a first reset pulse voltage Pr11 of the drive voltage V1 that is positive with respect to the third electrode 35 is applied to the first electrode 31 from the state in FIG. 9A, holes are supplied to the first variable resistive layer 32 via the first electrode 31, so that the metal device of the conductive filament 36 is ionized in the first variable resistive layer 32. Then, as shown in FIG. 9B, the metal ions are recovered in the upper electrode 33c and the conductive filament 36 is made to disappear in the first variable resistive layer 32, so that the first variable resistive layer 32 is reset to a high resistance state.

When a second reset pulse voltage Pr12 of the drive voltage Vii that is negative with respect to the third electrode 35 is applied to the first electrode 31 from the state in FIG. 9B, holes are supplied to the second variable resistive layer 34 via the third electrode 35, so that the metal element of the conductive filament 37 is ionized in the second variable resistive layer 34. Then, as shown in FIG. 9C, the metal ions are recovered in the lower electrode 33a and the conductive filament 37 is made to disappear in the second variable resistive layer 34, so that the second variable resistive layer 34 is reset to a high resistance state.

The first electrode 31 is arranged on the upper surface side of the first variable resistive layer 32 and the third electrode 35 is arranged on the lower surface side of the second variable resistive layer 34, so that holes can be supplied to the conductive filaments 36 and 37 from the first electrode 31 or the third electrode 35, enabling to improve the controllability of the resetting.

When causing the conductive filament 37 to disappear from the second variable resistive layer 34, the electric field is applied to the first variable resistive layer 32 in a direction in which the conductive filament 36 is formed. Therefore, it is needed to select the metal elements of the lower electrode 33a and the upper electrode 33c so that the condition of $|V1|>|Vii|$ is satisfied, in which Vii is a drive voltage when resetting the conductive filament 37 in FIG. 9C.

(Sixth Embodiment)

Next, the manufacturing method of the nonvolatile variable resistive device in FIG. 6 is explained. In this sixth embodiment, the case is explained as an example in which, in FIG. 6, Ni is used as the upper electrode 33c, Ag is used as the lower electrode 33a, $SiO_2$ is used as the diffusion barrier layer 33b, p-type Si is used as the first electrode 31 and the third electrode 35, and amorphous silicon is used as the first variable resistive layer 32 and the second variable resistive layer 34.

In FIG. 6, a p-type Si region, which is formed by implanting $B^+$ ions into a silicon single-crystal substrate and thereafter performing activation annealing, is used as the third electrode 35.

Next, for example, amorphous silicon is deposited as the second variable resistive layer 34 on the third electrode 35 by the CVD method.

Next, Ag to be the lower electrode 33a is deposited on the second variable resistive layer 34 by a method such as sputtering.

Next, $SiO_2$ to be the diffusion barrier layer 33b is deposited on the lower electrode 33a by a method such as sputtering.

Next, Ni to be the upper electrode 33c is deposited on the diffusion barrier layer 33b by a method such as sputtering.

Next, for example, amorphous silicon is deposited as the first variable resistive layer 32 on the upper electrode 33c by the CVD method.

Next, a doped silicon layer is formed as the first electrode 31 on the first variable resistive layer 32. In the forming method of this doped silicon layer, when the first variable resistive layer 32 is silicon, the first variable resistive layer 32 can be delta doped with boron B at a high concentration and activated. In order to suppress diffusion of boron B in the subsequent process, the Co-Implantation of implanting carbon C or the like together with boron B may be performed. Alternatively, a diffusion barrier layer, such as $SiO_2$, may be inserted at the interface between the first variable resistive layer 32 and the first electrode 31. Still alternatively, a doped germanium layer may be formed by implanting boron B into a Ge layer at a high concentration after depositing the Ge layer.

Because Ni has a cohesive energy higher than Ag, the drive voltage when the conductive filament 36 is formed in the first variable resistive layer 32 can be made higher than the drive voltage when the conductive filament 37 is formed in the second variable resistive layer 34. Therefore, the resistance of the nonvolatile variable resistive device can be changed in stages, so that a multi-level nonvolatile variable resistive device can be realized while increasing tolerance of the resistance value of the nonvolatile variable resistive device.

(Seventh Embodiment)

Figure 10:
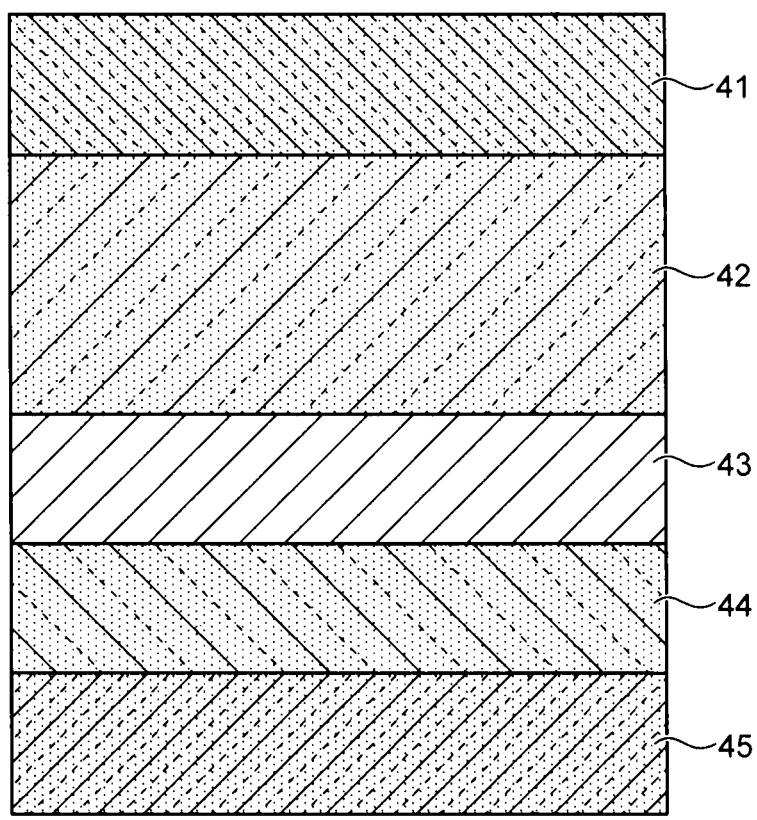
FIG. 10 is a cross-sectional view illustrating a schematic configuration of a nonvolatile variable resistive device according to a seventh embodiment.

FIG. 10 is a cross-sectional view illustrating a schematic configuration of a nonvolatile variable resistive device according to the seventh embodiment.

In FIG. 10, a first variable resistive layer 42 is arranged between a first electrode 41 and a second electrode 43 and a second variable resistive layer 44 is arranged between the second electrode 43 and a third electrode 45.

The second electrode 43 includes a metal element. As the second electrode 43, Ag, Au, Ti, Ni, Co, Al, Fe, Cr, Cu, W, Hf, Ta, Pt, Ru, Zr, or Ir, nitride or carbide thereof, a chalcogenide material, or the like can be used. Moreover, an alloy material including a plurality of such metal or semiconductor elements may be used as the second electrode 43.

The first electrode 41 and the third electrode 45 include a semiconductor element and, for example, a semiconductor layer doped with an impurity can be used. For example, when Si is the main component of the first variable resistive layer 42 and the second variable resistive layer 44, doped silicon can be used for the first electrode 41 and the third electrode 45. This doped silicon can be formed by activating an Si layer, into which boron is implanted at a high concentration, by a heat treatment. The sheet resistance of this doped silicon can be set, for example, equal to or lower than $3\times10^3 \Omega/\square$. The first electrode 41 and the third electrode 45 may be amorphous semiconductor, polycrystalline semiconductor, or single-crystal semiconductor.

The first variable resistive layer 42 and the second variable resistive layer 44 include a semiconductor element, and this semiconductor element can be selected, for example, from among Si, Ge, SiGe, GaAs, InP, GaP, GaInAsP, GaN, SiC, and the like. The first variable resistive layer 42 and the second variable resistive layer 44 may be amorphous semiconductor, polycrystalline semiconductor, or single-crystal semiconductor. N or O may be added to the semiconductor element and, for example, SiN or $SiO_2$ may be used. The first variable resistive layer 42 and the second variable resistive layer 44 may be composed of the same semiconductor element. The film thicknesses of the first variable resistive layer 42 and the second variable resistive layer 44 can be set to be different from each other, and, in FIG. 10, a case is illustrated in which the first variable resistive layer 42 has a larger film thickness than the second variable resistive layer 44. The film thickness of the first variable resistive layer 42 and the second variable resistive layer 44 is typically 1 nm to 300 nm. The film thickness is preferably as small as possible considering the scaling of the element, however, if the film thickness is too small, a homogeneous film cannot be formed, so that the film thickness is more preferably 2 nm to 20 nm.

The first variable resistive layer 42 and the second variable resistive layer 44 can reversibly change the resistance by filament formation and dissolution of the metal element of the second electrode 43.

Specifically, in the first variable resistive layer 42 and the second variable resistive layer 44, conductive filaments are formed of the metal element supplied from the second electrode 43, so that the first variable resistive layer 42 and the second variable resistive layer 44 change from a high resistance state to a low resistance state. The metal elements of the conductive filaments formed in the first variable resistive layer 42 and the second variable resistive layer 44 are recovered in the second electrode 43 and the conductive filaments formed in the first variable resistive layer 42 and the second variable resistive layer 44 disappear, so that the first variable resistive layer 42 and the second variable resistive layer 44 change from a low resistance state to a high resistance state.

The first variable resistive layer 42 and the second variable resistive layer 44 are made different from each other in film thickness, so that it is possible to make the drive voltage applied between the first electrode 41 and the third electrode 45 when a conductive filament is formed in the first variable resistive layer 42 and the drive voltage applied between the first electrode 41 and the third electrode 45 when a conductive filament is formed in the second variable resistive layer 44 different from each other.

Therefore, the resistance of the nonvolatile variable resistive device can be changed in stages, so that a multi-level nonvolatile variable resistive device can be realized while increasing tolerance of the resistance value of the nonvolatile variable resistive device.

Moreover, the second electrode 43 is arranged between the first variable resistive layer 42 and the second variable resistive layer 44, so that it is possible to make the polarities of the drive voltages different from each other between when a conductive filament is formed in the first variable resistive layer 42 and when a conductive filament is formed in the second variable resistive layer 44. Therefore, when a conductive filament in one of the first variable resistive layer 42 and the second variable resistive layer 44 is formed, a conductive filament can be prevented from being formed easily in the other thereof, enabling to improve the controllability of the setting.

Furthermore, the second electrode 43 is arranged between the first variable resistive layer 42 and the second variable resistive layer 44, so that conductive filaments can be formed in the first variable resistive layer 42 and the second variable resistive layer 44 to come into contact with the second electrode 43. Therefore, holes can be sufficiently supplied to both the conductive filaments from the second electrode 43, enabling to improve the controllability of the resetting.

Figure 11A:
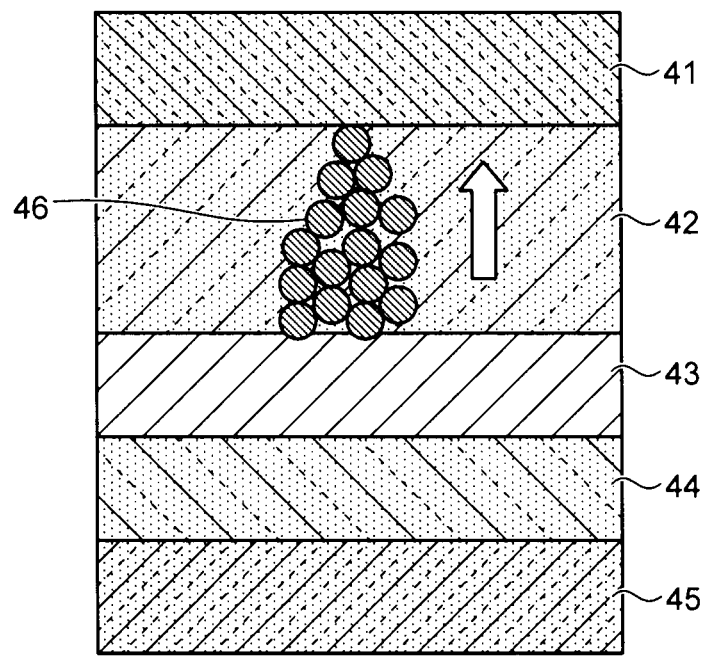
FIG. 11A is a cross-sectional view illustrating a first on-state of the nonvolatile variable resistive device according to the seventh embodiment.
Figure 11B:
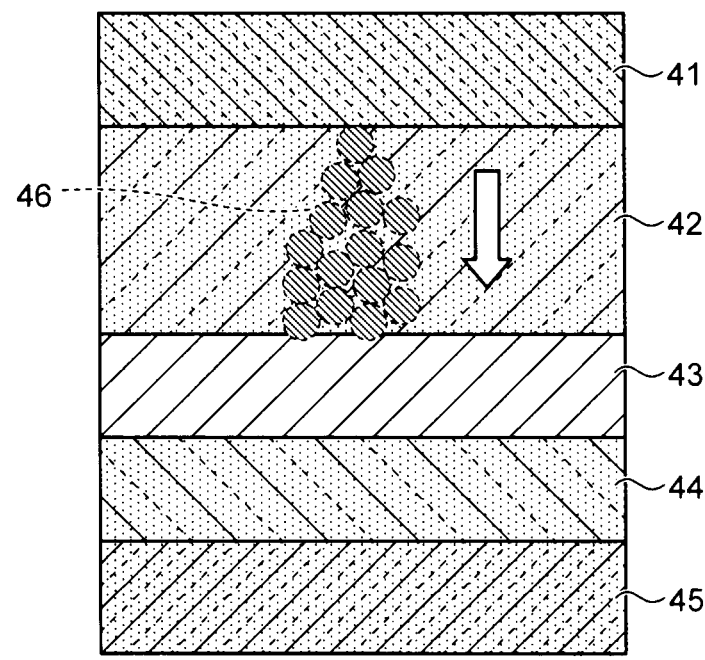
FIG. 11B is a cross-sectional view illustrating an off-state of the nonvolatile variable resistive device according to the seventh embodiment.

FIG. 11A is a cross-sectional view illustrating a first on-state of the nonvolatile variable resistive device according to the seventh embodiment and FIG. 11B is a cross-sectional view illustrating an off-state of the nonvolatile variable resistive device according to the seventh embodiment.

In FIG. 11A, if the nonvolatile variable resistive device is in the state in FIG. 10, when a voltage that is negative with respect to the third electrode 45 is applied to the first electrode 41, the metal element of the second electrode 43 is ionized and the metal ions diffuse in the first variable resistive layer 42, and electrons are supplied to the first variable resistive layer 42 via the first electrode 41. Then, in the first variable resistive layer 42, the metal ions and the electrons are combined, so that a conductive filament 46 formed of the metal element of the second electrode 43 is formed. Therefore, the first variable resistive layer 42 is set to a low resistance state.

When a voltage that is positive with respect to the third electrode 45 is applied to the first electrode 41 from the state in FIG. 11A, as shown in FIG. 11B, holes are supplied to the first variable resistive layer 42 via the first electrode 41, so that the metal element of the conductive filament 46 is ionized in the first variable resistive layer 42. Then, the metal ions are recovered in the second electrode 43 and the conductive filament 46 is made to disappear in the first variable resistive layer 42, so that the first variable resistive layer 42 is reset to a high resistance state.

When a voltage that is negative with respect to the third electrode 45 is applied to the first electrode 41 again from the state in FIG. 11B, as shown in FIG. 11A, the conductive filament 46 is formed in the first variable resistive layer 42 again. In other words, the state in FIG. 11A and the state in FIG. 11B are reversibly controllable. These two states are made to correspond to an on-state and an off-state, respectively, so that a binary nonvolatile variable resistive memory can be realized.

Next, the method of multi-leveling the nonvolatile variable resistive device is explained.

As described above, the first variable resistive layer 42 and the second variable resistive layer 44 are different from each other in film thickness, so that the drive voltages, at which conductive filaments are formed in the first variable resistive layer 42 and the second variable resistive layer 44, are different from each other. A multi-level nonvolatile variable resistive device can be realized by using this difference in the drive voltage.

Figure 12A:
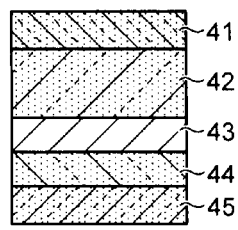
FIG. 12A to FIG. 12C are cross-sectional views illustrating a forming process of conductive filaments at a time of writing of the nonvolatile variable resistive device according to the seventh embodiment.
Figure 12B:
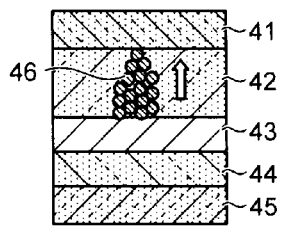
Figure 12C:
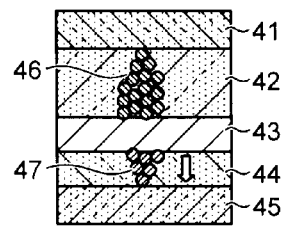
Figure 12D:
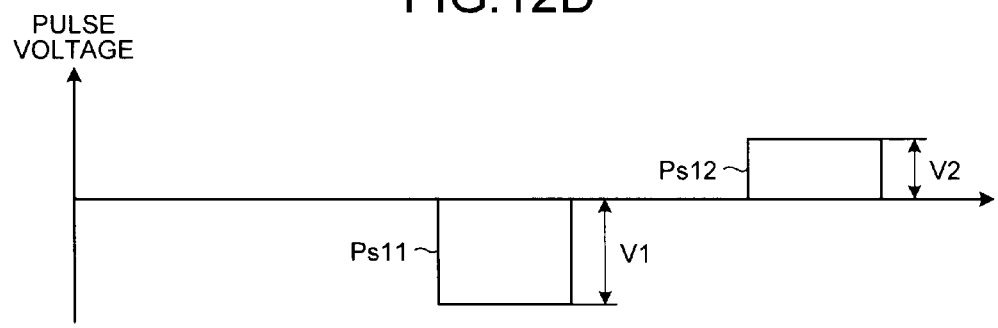
FIG. 12D is a timing chart illustrating a pulse-voltage applying method at a time of writing of the nonvolatile variable resistive device according to the seventh embodiment.
Figure 12E:
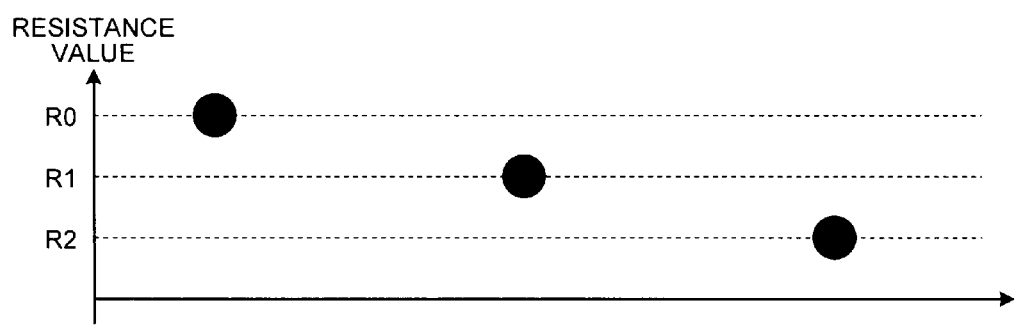
FIG. 12E is a diagram illustrating a changing state of a resistance value at a time of writing of the nonvolatile variable resistive device according to the seventh embodiment.

FIG. 12A to FIG. 12C are cross-sectional views illustrating a forming process of conductive filaments at a time of writing of the nonvolatile variable resistive device according to the seventh embodiment, FIG. 12D is a timing chart illustrating a pulse-voltage applying method at a time of writing of the nonvolatile variable resistive device according to the seventh embodiment, and FIG. 12E is a diagram illustrating a changing state of a resistance value at a time of writing of the nonvolatile variable resistive device according to the seventh embodiment.

In FIG. 12A, when the conductive filaments 46 and 47 are not formed in the first variable resistive layer 42 and the second variable resistive layer 44, respectively, the first variable resistive layer 42 and the second variable resistive layer 44 are in a high resistance state, and the resistance value of this nonvolatile variable resistive device becomes R0.

When the first set pulse voltage Ps11 of the drive voltage V1 that is negative with respect to the third electrode 45 is applied to the first electrode 41 from the state in FIG. 12A, the metal element of the second electrode 43 is ionized and the metal ions diffuse in the first variable resistive layer 42, and electrons are supplied to the first variable resistive layer 42 via the first electrode 41. Then, in the first variable resistive layer 42, the metal ions and the electrons are combined, so that, as shown in FIG. 12B, the conductive filament 46 formed of the metal element of the second electrode 43 is formed, whereby the first variable resistive layer 42 is set to a low resistance state. At this time, the first variable resistive layer 42 is in a low resistance state and the second variable resistive layer 44 is in a high resistance state, and the resistance value of this nonvolatile variable resistive device becomes R1 that satisfies R0>R1.

When the second set pulse voltage Ps12 of the drive voltage V2 that is positive with respect to the third electrode 45 is applied to the first electrode 41 from the state in FIG. 12B, the metal element of the second electrode 43 is ionized and the metal ions diffuse in the second variable resistive layer 44, and electrons are supplied to the second variable resistive layer 44 via the third electrode 45. Then, in the second variable resistive layer 44, the metal ions and the electrons are combined, so that the conductive filament 47 formed of the metal element of the second electrode 43 is formed, whereby the second variable resistive layer 44 is set to a low resistance state. At this time, the first variable resistive layer 42 and the second variable resistive layer 44 are in a low resistance state and the resistance value of this nonvolatile variable resistive device becomes R2 that satisfies R0>R1>R2.

Consequently, the resistance value of the nonvolatile variable resistive device can be changed in three stages, so that a three-level nonvolatile variable resistive device can be realized. Moreover, the resistance values R0, R1, and R2 of this nonvolatile variable resistive device can take discrete values, so that the tolerance of the resistance values R0, R1, and R2 can be increased. Therefore, even when the resistance values R0, R1, and R2 vary, erroneous reading of data can be reduced.

Moreover, it is possible to make the polarity of the electric field applied to the first variable resistive layer 42 opposite between when the conductive filament 46 is formed in the first variable resistive layer 42 and when the conductive filament 47 is formed in the second variable resistive layer 44. Therefore, when forming the conductive filament 46 in the first variable resistive layer 42, the conductive filament 47 can be prevented from being formed in the second variable resistive layer 44, enabling to improve the property of changing the resistance in stages in the nonvolatile variable resistive device.

FIG. 13A to FIG. 13C are cross-sectional views illustrating a forming process of conductive filaments at a time of erasing of the nonvolatile variable resistive device according to the seventh embodiment, FIG. 13D is a timing chart illustrating a pulse-voltage applying method at a time of erasing of the nonvolatile variable resistive device according to the seventh embodiment, and FIG. 13E is a diagram illustrating a changing state of a resistance value at a time of erasing of the nonvolatile variable resistive device according to the seventh embodiment.

When the first reset pulse voltage Pr11 of the drive voltage V1 that is positive with respect to the third electrode 45 is applied to the first electrode 41 from the state in FIG. 13A, holes are supplied to the first variable resistive layer 42 via the first electrode 41, so that the metal element of the conductive filament 46 is ionized in the first variable resistive layer 42. Then, as shown in FIG. 13B, the metal ions are recovered in the second electrode 43 and the conductive filament 46 is made to disappear in the first variable resistive layer 42, so that the first variable resistive layer 42 is reset to a high resistance state.

When the second reset pulse voltage Pr12 of the drive voltage Vii that is negative with respect to the third electrode 45 is applied to the first electrode 41 from the state in FIG. 13B, holes are supplied to the second variable resistive layer 44 via the third electrode 45, so that the metal element of the conductive filament 47 is ionized in the second variable resistive layer 44. Then, as shown in FIG. 13C, the metal ions are recovered in the second electrode 43 and the conductive filament 47 is made to disappear in the second variable resistive layer 44, so that the second variable resistive layer 44 is reset to a high resistance state.

The first electrode 41 is arranged on the upper surface side of the first variable resistive layer 42 and the third electrode 45 is arranged on the lower surface side of the second variable resistive layer 44, so that holes or electrons can be supplied to the conductive filament 46 or 47 from the first electrode 41 or the third electrode 45, enabling to improve the controllability of the resetting.

(Eighth Embodiment)

Next, the manufacturing method of the nonvolatile variable resistive device in FIG. 10 is explained.

In this eighth embodiment, the case is explained as an example in which, in FIG. 10, p-type Si is used as the first electrode 41 and the third electrode 45, Ag is used as the second electrode 43, and amorphous silicon is used as the first variable resistive layer 42 and the second variable resistive layer 44.

In FIG. 10, a p-type Si region, which is formed by implanting $B^+$ ions into a silicon single-crystal substrate and thereafter performing activation annealing, is used as the third electrode 45.

Next, for example, amorphous silicon is deposited as the second variable resistive layer 44 on the third electrode 45 by the CVD method.

Next, Ag to be the second electrode 43 is deposited on the second variable resistive layer 44 by a method such as sputtering.

Next, for example, amorphous silicon is deposited as the first variable resistive layer 42 on the second electrode 43 by the CVD method.

Next, a doped silicon layer is formed as the first electrode 41 on the first variable resistive layer 42. In the forming method of this doped silicon layer, when the first variable resistive layer 42 is silicon, the first variable resistive layer 42 can be delta doped with boron B at a high concentration and activated. In order to suppress diffusion of boron B in the subsequent process, the Co-Implantation of implanting carbon C or the like together with boron B may be performed. Alternatively, a diffusion barrier layer, such as $SiO_2$, may be inserted at the interface between the first variable resistive layer 42 and the first electrode 41. Still alternatively, a doped germanium layer may be formed by implanting boron B into a Ge layer at a high concentration after depositing the Ge layer.

Because the first variable resistive layer 42 is larger in the film thickness than the second variable resistive layer 44, the drive voltage when a conductive filament is formed in the first variable resistive layer 42 can be made higher than the drive voltage when a conductive filament is formed in the second variable resistive layer 44. Therefore, the resistance of the nonvolatile variable resistive device can be changed in stages, so that a multi-level nonvolatile variable resistive device can be realized while increasing tolerance of the resistance value of the nonvolatile variable resistive device.

(Ninth Embodiment)

Figure 14:
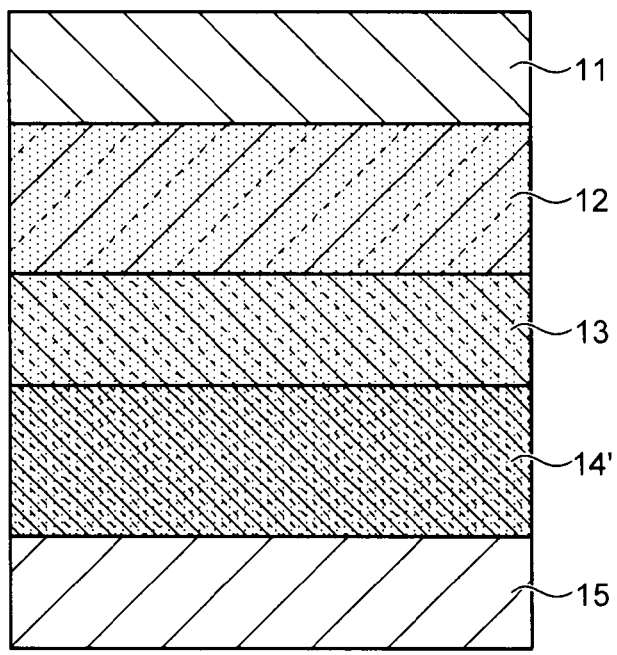
FIG. 14 is a cross-sectional view illustrating a schematic configuration of a nonvolatile variable resistive device according to a ninth embodiment.

FIG. 14 is a cross-sectional view illustrating a schematic configuration of a nonvolatile variable resistive device according to the ninth embodiment.

In FIG. 14, in this nonvolatile variable resistive device, a second variable resistive layer 14' is provided instead of the second variable resistive layer 14 in FIG. 1. The second variable resistive layer 14' is formed by doping the second variable resistive layer 14 with an impurity. As this impurity, for example, B, P, As, In, C, or Ge can be used.

Consequently, the resistance value of the second variable resistive layer 14' can be reduced, so that it is possible to control specific resistances of the resistance value in an off-state and the resistance value in a first on-state of the nonvolatile variable resistive device.

In this embodiment, a variable resistive layer whose drive voltage for forming a conductive filament is smaller is doped with an impurity. This method may be applied to the configuration in FIG. 1, FIG. 5, FIG. 6 or FIG. 10 other than the configuration in FIG. 14.

(Tenth Embodiment)

Next, the manufacturing method of the nonvolatile variable resistive device in FIG. 14 is explained.

In FIG. 14, the manufacturing method of this nonvolatile variable resistive device is similar to the manufacturing method of the nonvolatile variable resistive device in FIG. 1 except that after depositing amorphous silicon as the second variable resistive layer 14' on the third electrode 15, a process of ion-implanting an impurity, such as boron B, into this amorphous silicon is added.

(Eleventh Embodiment)

Figure 15:
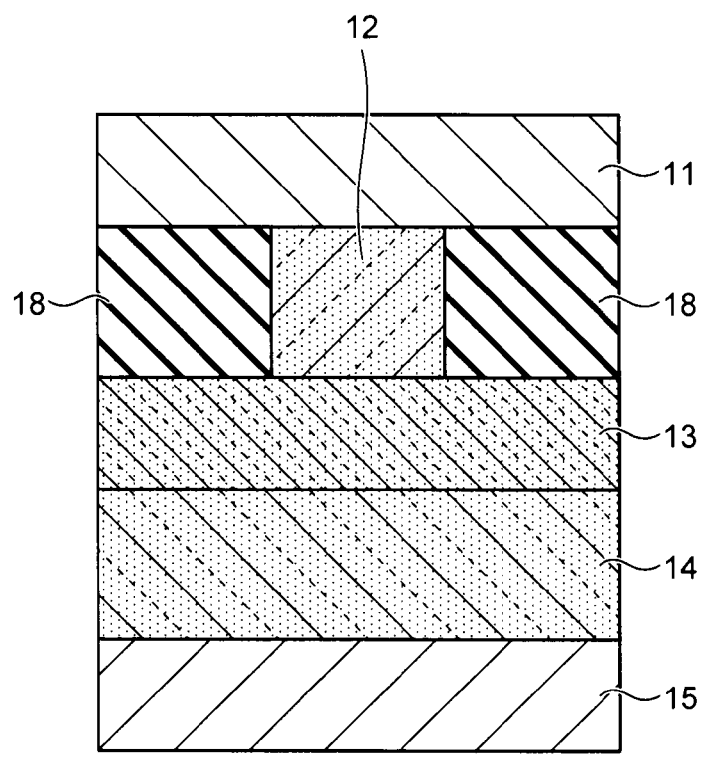
FIG. 15 is a cross-sectional view illustrating a schematic configuration of a nonvolatile variable resistive device according to an eleventh embodiment.

FIG. 15 is a cross-sectional view illustrating a schematic configuration of a nonvolatile variable resistive device according to the eleventh embodiment.

In FIG. 15, in this nonvolatile variable resistive device, an insulating layer 18 is added to the first variable resistive layer 12 in the configuration in FIG. 1. The insulating layer 18 can be arranged such that the area of the current path of the first variable resistive layer 12 becomes smaller than the area of the current path of the second variable resistive layer 14. As the insulating layer 18, for example, $SiO_2$, $Si_3N_4$, or $Al_2O_3$ can be used.

Consequently, the resistance value of the first variable resistive layer 12 can be increased, so that it is possible to control specific resistances of the resistance value in an off-state and the resistance value in a first on-state of the nonvolatile variable resistive device.

In this embodiment, the insulating layer is formed in the variable resistive layer whose drive voltage for forming a conductive filament is larger. This method may be applied to the configuration in FIG. 1, FIG. 5, FIG. 6, FIG. 10, or FIG. 14 other than the configuration in FIG. 15.

(Twelfth Embodiment)

Next, the manufacturing method of the nonvolatile variable resistive device in FIG. 15 is explained.

In FIG. 15, the manufacturing method of this nonvolatile variable resistive device is similar to the manufacturing method of the nonvolatile variable resistive device in FIG. 1 except that after depositing amorphous silicon as the first variable resistive layer 12 on the second electrode 13, a process of patterning the amorphous silicon by using the photolithography technology and the dry etching technology and then forming the insulating layer 18, such as $SiO_2$, on the second electrode 13 so that this patterned amorphous silicon is embedded is added.

(Thirteenth Embodiment)

Figure 16:
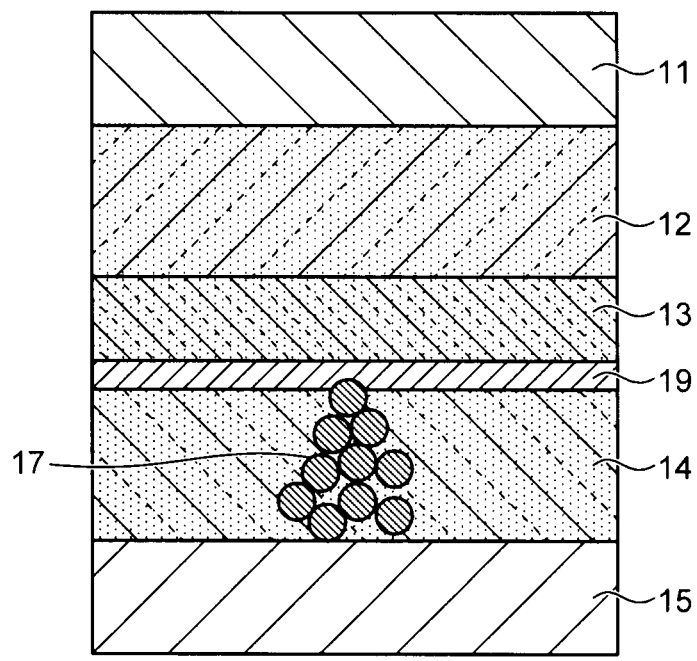
FIG. 16 is a cross-sectional view illustrating a schematic configuration of a nonvolatile variable resistive device according to a thirteenth embodiment.

FIG. 16 is a cross-sectional view illustrating a schematic configuration of a nonvolatile variable resistive device according to the thirteenth embodiment.

In FIG. 16, in this nonvolatile variable resistive device, a dielectric layer 19 is added between the second electrode 13 and the second variable resistive layer 14 in the configuration in FIG. 1. A material whose dielectric constant is smaller than the second variable resistive layer 14 can be used for the dielectric layer 19. For example, when the second variable resistive layer 14 is formed of amorphous silicon or polysilicon, $SiO_2$, $Si_3N_4$, $Al_2O_3$, or the like can be used for the dielectric layer 19.

Consequently, when a voltage is applied at the time of causing the conductive filament 17 to disappear, the voltage can be concentrated on the dielectric layer 19. Therefore, voltage concentration on the first variable resistive layer 12 in which the conductive filament 16 is to be formed can be avoided, enabling to make the conductive filament 17 disappear easily.

In this embodiment, the dielectric layer is formed between the variable resistive layer whose drive voltage for forming a conductive filament is smaller and the electrode layer. This method may be applied to the configuration in FIG. 1, FIG. 5, FIG. 6, FIG. 10, FIG. 14, or FIG. 15 other than the configuration in FIG. 16.

(Fourteenth Embodiment)

Next, the manufacturing method of the nonvolatile variable resistive device in FIG. 16 is explained.

In FIG. 16, the manufacturing method of this nonvolatile variable resistive device is similar to the manufacturing method of the nonvolatile variable resistive device in FIG. 1 except that after depositing amorphous silicon as the second variable resistive layer 14 on the third electrode 15, a process of forming the dielectric layer 19, such as $SiO_2$, on the amorphous silicon is added.

(Fifteenth Embodiment)

Figure 17:
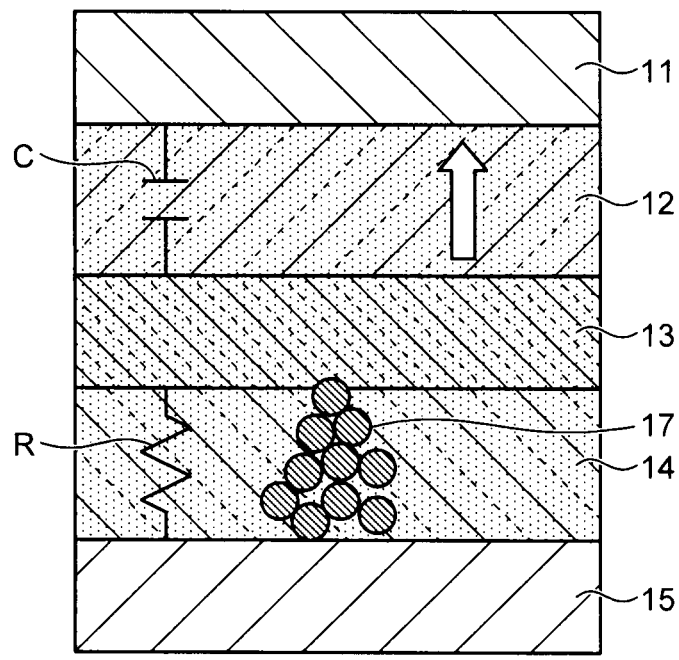
FIG. 17 is a cross-sectional view illustrating a capacitance and a resistance formed in the nonvolatile variable resistive device in FIG. 1.

FIG. 17 is a cross-sectional view illustrating a capacitance and a resistance formed in the nonvolatile variable resistive device in FIG. 1.

In FIG. 17, C indicates a capacitance in the first variable resistive layer 12 and R indicates a resistance of the second variable resistive layer 14 when the conductive filament 16 of the first variable resistive layer 12 is made to disappear and the conductive filament 17 is present in the second variable resistive layer 14.

Figure 18:
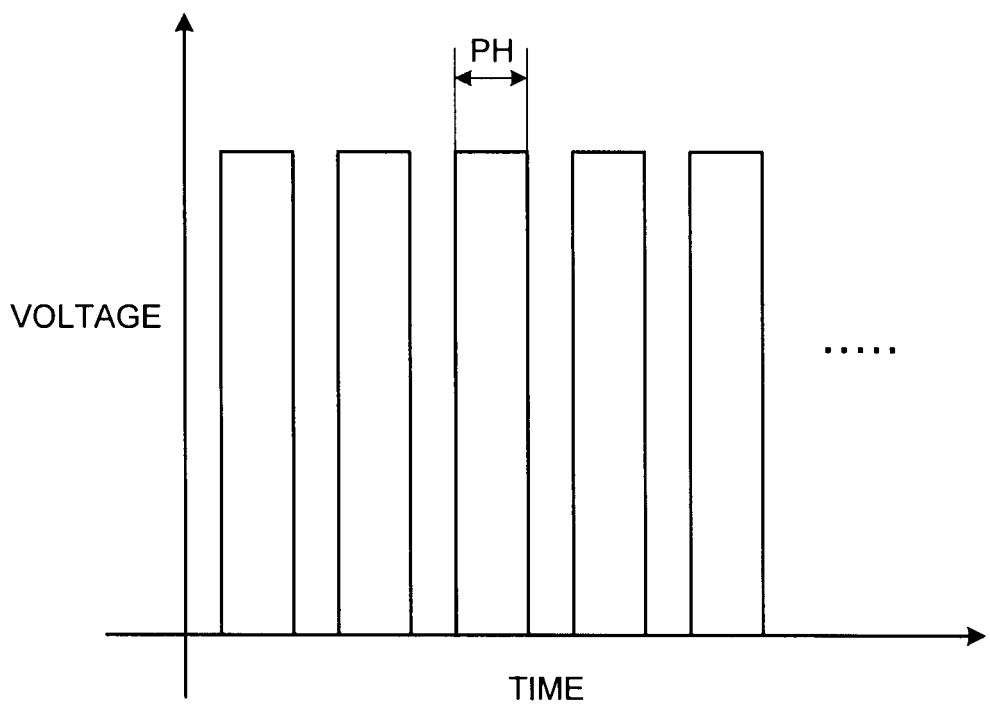
FIG. 18 is a timing chart illustrating a pulse-voltage applying method at a time of erasing of a nonvolatile variable resistive device according to the fifteenth embodiment.

FIG. 18 is a timing chart illustrating a pulse-voltage applying method at a time of erasing of a nonvolatile variable resistive device according to the fifteenth embodiment.

In FIG. 18, when causing the conductive filament 17 formed in the second variable resistive layer 14 to disappear, a pulse width PH of the second reset pulse Pr2 can be made smaller than a CR time constant of the capacitance C and the resistance R in FIG. 17. The second reset pulse Pr2 may be a single pulse or multiple pulses.

Consequently, when a voltage is applied at the time of causing the conductive filament 17 to disappear, it is possible to prevent a voltage from being applied easily to the first variable resistive layer 12 in which the conductive filament 16 is to be formed, so that a voltage can be concentrated on the second variable resistive layer 14. Therefore, the conductive filament 17 can be made to disappear easily.

(Sixteenth Embodiment)

Figure 19A:
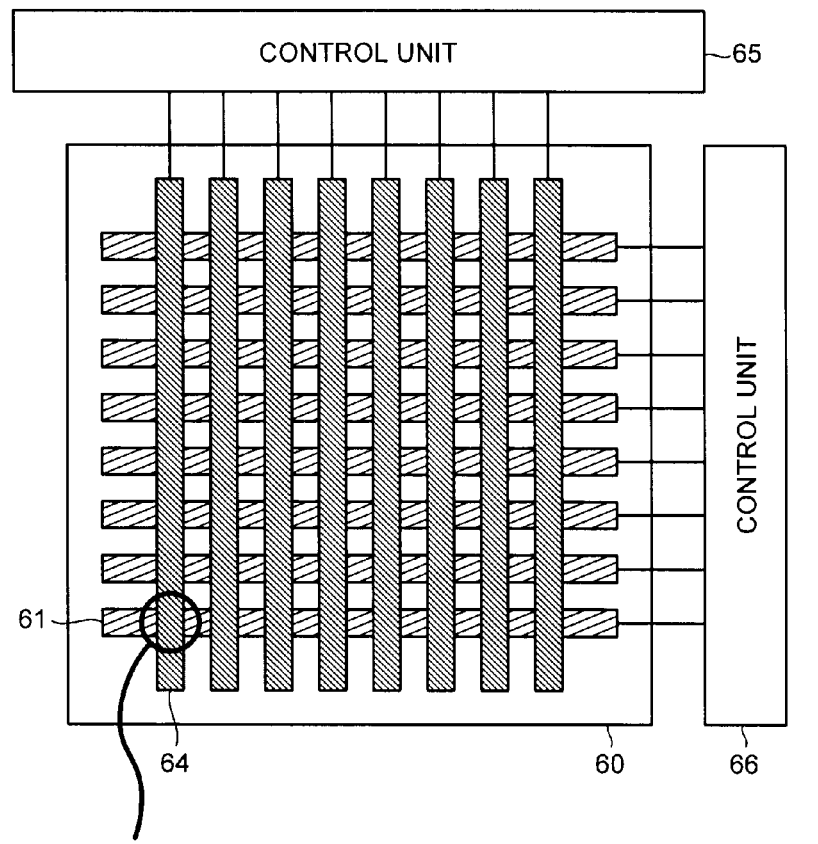
FIG. 19A is a plan view illustrating a schematic configuration of a memory cell array to which nonvolatile variable resistive devices according to a sixteenth embodiment are applied.
Figure 19B:
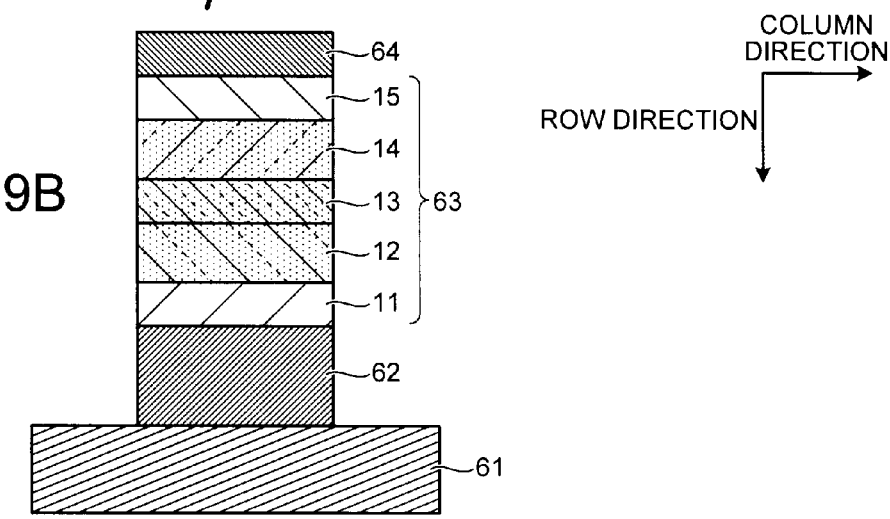
FIG. 19B is a cross-sectional view illustrating a schematic configuration of a cross-point portion of the memory cell array in FIG. 19A.

FIG. 19A is a plan view illustrating a schematic configuration of a memory cell array to which nonvolatile variable resistive device according to the sixteenth embodiment are applied and FIG. 19B is a cross-sectional view illustrating a schematic configuration of a cross-point portion of the memory cell array in FIG. 19A.

In FIG. 19A and FIG. 19B, in a memory cell array 60, lower wires 61 are formed in a column direction and upper wires 64 are formed in a row direction. A nonvolatile variable resistive device 63 is arranged at each of the cross-point portions of the lower wires 61 and the upper wires 64 via a rectifier device 62. As the rectifier device 62, for example, a diode element such as an M-I-M diode can be used. As the nonvolatile variable resistive device 63, for example, the nonvolatile variable resistive device in FIG. 1, FIG. 5, FIG. 6, FIG. 10, FIG. 14, FIG. 15, or FIG. 16 can be used. In the example in FIG. 19B, the method of providing the rectifier device 62 to the nonvolatile variable resistive device 63 is explained, however, the rectifier device 62 may be removed.

Figure 20:
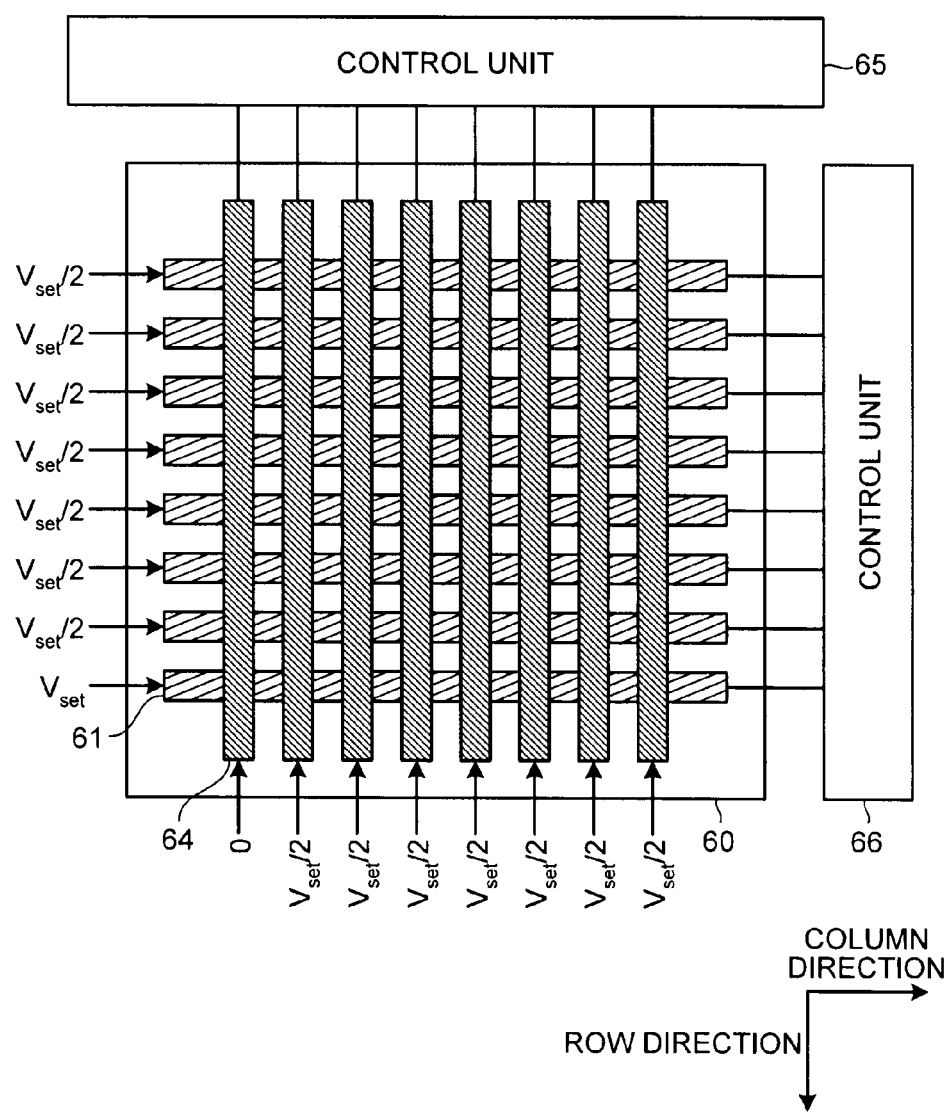
FIG. 20 is a plan view illustrating a voltage setting method at a time of writing of a selected cell in the memory cell array in FIG. 19A.

FIG. 20 is a plan view illustrating a voltage setting method at a time of writing of a selected cell in the memory cell array in FIG. 19A.

In FIG. 20, a control unit 65 that performs row selection and a control unit 66 that performs column selection are provided around the memory cell array 60. When performing writing on a selected cell, a set voltage $V_{set}$ is applied to the lower wire 61 of a selected column and a voltage that is ½ of the set voltage $V_{set}$ is applied to the lower wires 61 of non-selected columns. Moreover, 0 V is applied to the upper wire 64 of a selected row and a voltage that is ½ of the set voltage $V_{set}$ is applied to the upper wires 64 of non-selected rows.

Consequently, the set voltage $V_{set}$ is applied to the selected cell specified by the selected column and the selected row and writing is performed. On the other hand, a voltage that is ½ of the set voltage $V_{set}$ is applied to the half-selected cells specified by the non-selected columns and the selected row and writing is prohibited. Moreover, a voltage that is ½ of the set voltage $V_{set}$ is applied to the half-selected cells specified by the selected column and the non-selected rows and writing is prohibited. Furthermore, 0 V is applied to the non-selected cells specified by the non-selected columns and the non-selected rows and writing is prohibited.

Figure 21:
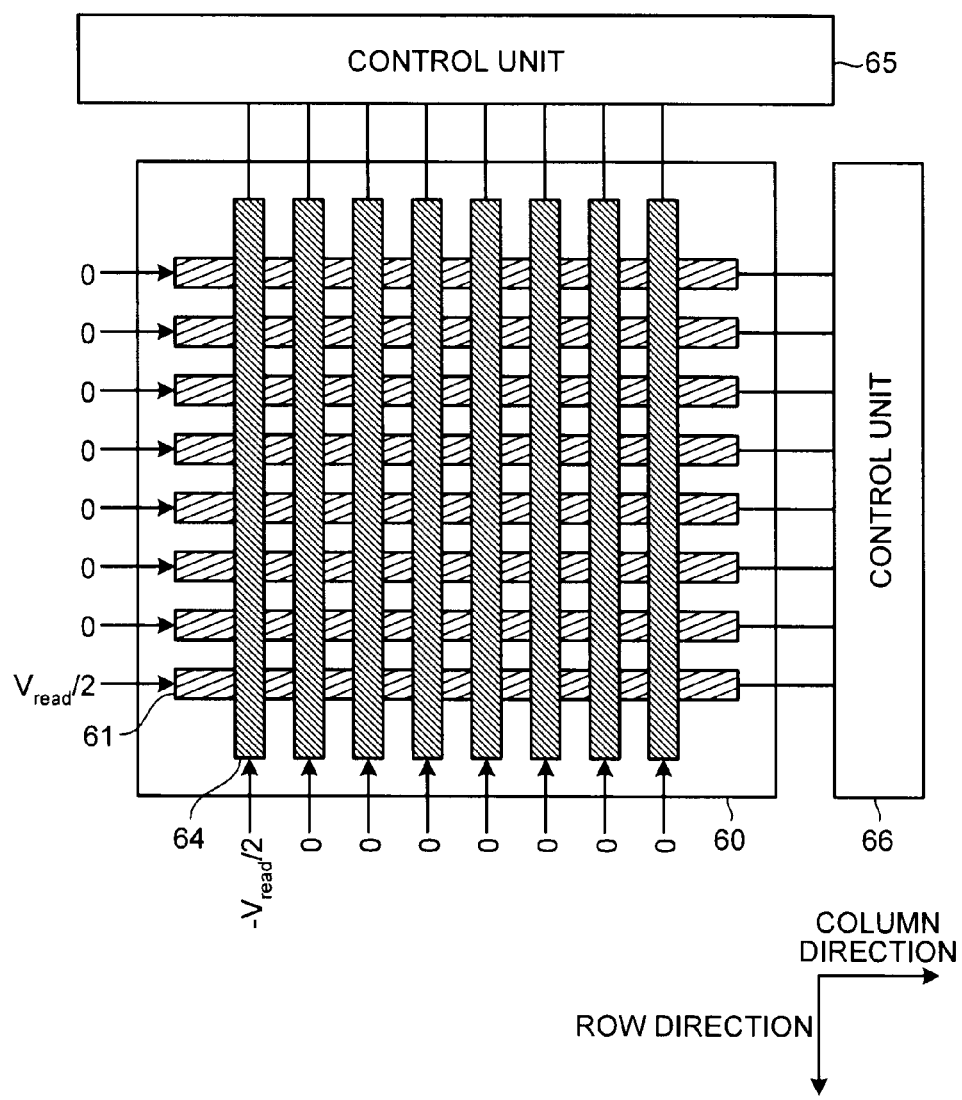
FIG. 21 is a plan view illustrating a voltage setting method at a time of reading of a selected cell in the memory cell array in FIG. 19A.

FIG. 21 is a plan view illustrating a voltage setting method at a time of reading of a selected cell in the memory cell array in FIG. 19A.

In FIG. 21, when performing reading from the selected cell, a voltage that is ½ of a read voltage $V_{read}$ is applied to the lower wire 61 of the selected column and 0 V is applied to the lower wires 61 of the non-selected columns. Moreover, a voltage that is −½ of the read voltage $V_{read}$ is applied to the upper wire 64 of the selected row and 0 V is applied to the upper wires 64 of the non-selected rows.

Consequently, the read voltage $V_{read}$ is applied to the selected cell specified by the selected column and the selected row and reading is performed. On the other hand, a voltage that is −½ of the read voltage $V_{read}$ is applied to the half-selected cells specified by the non-selected columns and the selected row and reading is prohibited. Moreover, a voltage that is ½ of the read voltage $V_{read}$ is applied to the half-selected cells specified by the selected column and the non-selected rows and reading is prohibited. Furthermore, 0 V is applied to the non-selected cells specified by the non-selected columns and the non-selected rows and reading is prohibited.

Figure 22:
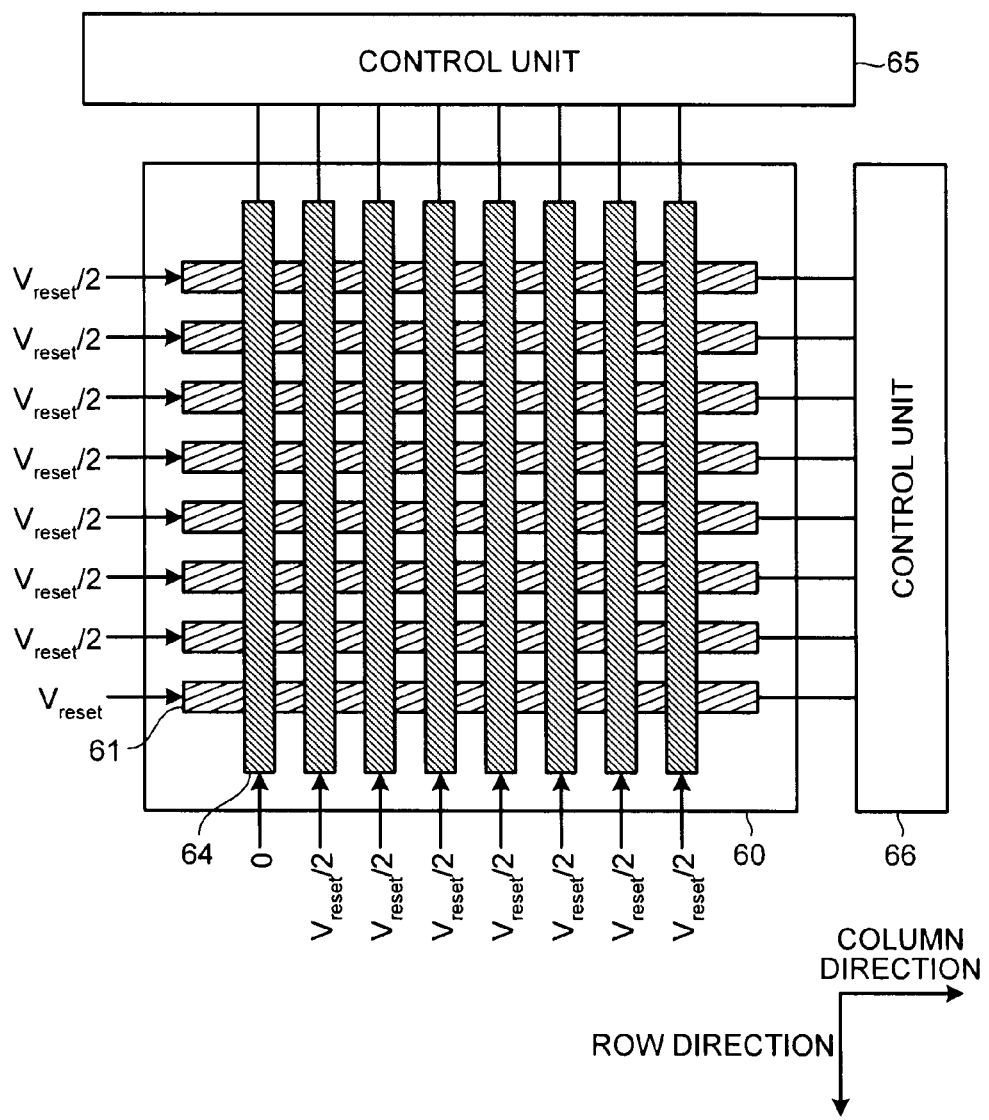
FIG. 22 is a plan view illustrating a voltage setting method at a time of erasing of a selected cell in the memory cell array in FIG. 19A.

FIG. 22 is a plan view illustrating a voltage setting method at a time of erasing of a selected cell in the memory cell array in FIG. 19A.

In FIG. 22, when performing erasing on the selected cell, a reset voltage $V_{reset}$ is applied to the lower wire 61 of the selected column and a voltage that is ½ of the reset voltage $V_{reset}$ is applied to the lower wires 61 of the non-selected columns. Moreover, 0 V is applied to the upper wire 64 of the selected row and a voltage that is ½ of the reset voltage $V_{reset}$ is applied to the upper wires 64 of the non-selected rows.

Consequently, the reset voltage $V_{reset}$ is applied to the selected cell specified by the selected column and the selected row and erasing is performed. On the other hand, a voltage that is ½ of the reset voltage $V_{reset}$ is applied to the half-selected cells specified by the non-selected columns and the selected row and erasing is prohibited. Moreover, a voltage that is ½ of the set voltage $V_{reset}$ is applied to the half-selected cells specified by the selected column and the non-selected rows and erasing is prohibited. Furthermore, 0 V is applied to the non-selected cells specified by the non-selected columns and the non-selected rows and erasing is prohibited.

(Seventeenth Embodiment)

Figure 23:
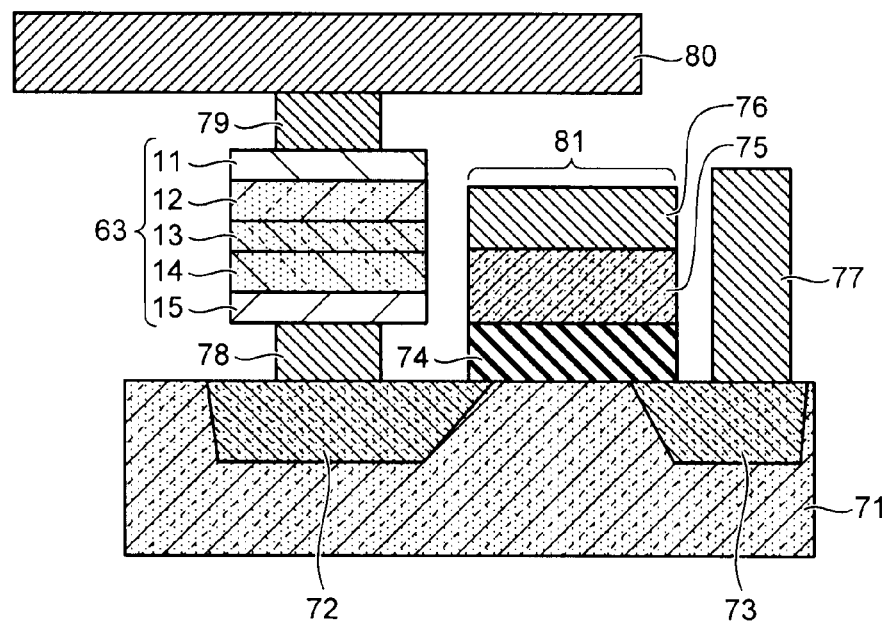
FIG. 23 is a cross-sectional view illustrating a schematic configuration of a nonvolatile variable resistive device according to a seventeenth embodiment.

FIG. 23 is a cross-sectional view illustrating a schematic configuration of a nonvolatile variable resistive device according to the seventeenth embodiment.

In FIG. 23, a gate electrode 75 is formed on a semiconductor substrate 71 via a gate insulating film 74 and a word line 76 is formed on the gate electrode 75. In the semiconductor substrate 71, impurity diffusion layers 72 and 73 are formed to sandwich a channel region formed under the gate electrode 75, thereby forming a transistor 81. A source line 77 is connected to the impurity diffusion layer 73.

The nonvolatile variable resistive device 63 is arranged over the semiconductor substrate 71 to be adjacent to the transistor 81. As the nonvolatile variable resistive device 63, for example, the configuration similar to that in FIG. 1 can be used. The third electrode 15 of the nonvolatile variable resistive device 63 is connected to the impurity diffusion layer 72 via a connection conductor 78 and the first electrode 11 of the nonvolatile variable resistive device 63 is connected to a bit line 80 via a connection conductor 79.

When the transistor 81 is turned on via the word line 76, it is possible to access the nonvolatile variable resistive device 63, enabling to select the nonvolatile variable resistive device 63 to be a read and write target.

In the example in FIG. 23, the case is explained in which the configuration in FIG. 1 is used as the nonvolatile variable resistive device 63, however, the configuration in FIG. 5, FIG. 6, FIG. 10, FIG. 14, FIG. 15, or FIG. 16 may be used.

Figure 24:
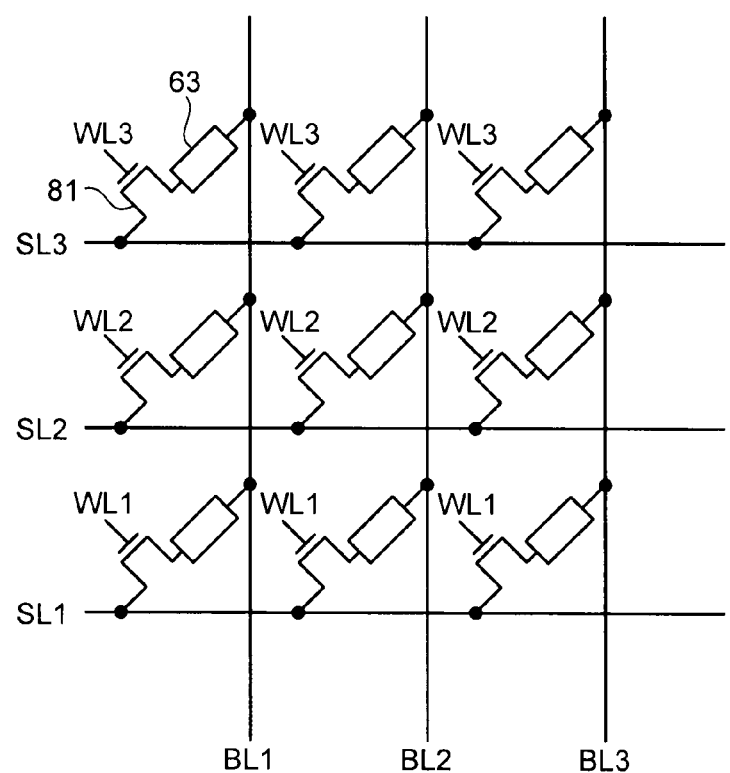
FIG. 24 is a block diagram illustrating a schematic configuration of a memory cell array to which the nonvolatile variable resistive devices in FIG. 23 are applied.

FIG. 24 is a block diagram illustrating a schematic configuration of a memory cell array to which the nonvolatile variable resistive device in FIG. 23 are applied.

In FIG. 24, bit lines BL1 to BL3 are wired in a column direction and word lines WL1 to WL3 are wired in a row direction on the semiconductor substrate 71 in FIG. 23. At each of the cross-point portions of the bit lines BL1 to BL3 and the word lines WL1 to WL3, the nonvolatile variable resistive device 63 and the transistor 81 are arranged, and the nonvolatile variable resistive device 63 and the transistor 81 are connected in series with each other.

One ends of the nonvolatile variable resistive device 63 in the same column are connected to the same bit line of the bit lines BL1 to BL3 and one ends of the transistors 81 in the same row are connected to the same source line of source lines SL1 to SL3. Moreover, the gate electrodes 75 of the transistors 81 in the same row are connected to the same word line of the word lines WL1 to WL3.

A voltage can be applied between the first electrode 11 and the second electrode 15 of the nonvolatile variable resistive device 63 of a selected row by turning on the transistor 81 via the word line of the word lines WL1 to WL3. Therefore, it is possible to prevent current from flowing in the nonvolatile variable resistive devices 63 of non-selected rows at the time of reading of the nonvolatile variable resistive device 63 of the selected row, whereby the read time can be shortened.

(Eighteenth Embodiment)

In the above embodiments, an example of realizing a three-level nonvolatile variable resistive device is explained, however, it is applicable that the degree of expansion and contraction of a filament is controlled by controlling current injected into the nonvolatile variable resistive device when changing the first variable resistive layer or the second variable resistive layer from an off-state to an on-state (current compliance control method) thereby causing the nonvolatile variable resistive device to store data of four or more levels.

(Nineteenth Embodiment)

In the above embodiments, an example of realizing a three-level nonvolatile variable resistive device by stacking only two variable resistive layers is explained, however, data of four or more levels may be stored in the nonvolatile variable resistive device by changing the number of stacked variable resistive layers to N(N is an integer of three or larger). At this time, the drive voltage when a conductive filament is formed in each variable resistive layer can be made different by making the film thicknesses of the N number of variable resistive layers different from each other, enabling to change the resistance value of the nonvolatile variable resistive device in stages.

Moreover, a conductive filament formed in each variable resistive layer can be brought into contact with a semiconductor electrode by arranging a metal electrode and a semiconductor electrode alternately with respect to the N number of variable resistive layers. Therefore, holes can be sufficiently supplied from the semiconductor electrode to any conductive filament, enabling to improve the controllability of the resetting.

For example, in the stacked structure of a first Ag electrode→a first amorphous silicon layer→a first p-type Si layer→a second amorphous silicon layer→a second Ag electrode→a third amorphous silicon layer→a second p-type Si layer, four-level recording can be realized while enabling to change the resistance value of the nonvolatile variable resistive device in stages by making the film thicknesses of the first amorphous silicon layer, the second amorphous silicon layer, and the third amorphous silicon layer different from each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile variable resistive device comprising:
a first electrode including a metal element;
a second electrode including a semiconductor element;
a third electrode including a metal element;
a first variable resistive layer that is arranged between the first electrode and the second electrode and is capable of reversibly changing a resistance by a first filament formation and dissolution, the first filament made of the metal element of the first electrode; and
a second variable resistive layer that is arranged between the second electrode and the third electrode and is capable of reversibly changing a resistance by a second filament formation and dissolution, the second filament made of the metal element of the third electrode, wherein
a first resistance value, a second resistance value larger than the first resistance value, and a third resistance value larger than the second resistance value are provided,
an absolute value of a drive voltage when changing between the first resistance value and the second resistance value and an absolute value of a drive voltage when changing between the second resistance value and the third resistance value are different from each other, and
the metal element of the first electrode and the metal element of the third electrode are different from each other.

2. The nonvolatile variable resistive device according to claim 1, wherein the metal element of the first electrode and the metal element of the third electrode are selected so that at least any one of a diffusion rate, an ionization energy, and a cohesive energy in the first variable resistive layer or the second variable resistive layer is different from each other.

3. The nonvolatile variable resistive device according to claim 1, wherein a main component of the first variable resistive layer and the second variable resistive layer is Si.

4. The nonvolatile variable resistive device according to claim 3, wherein the second electrode is doped silicon.

5. The nonvolatile variable resistive device according to claim 1, wherein
a set voltage of the first variable resistive layer and a reset voltage of the second variable resistive layer are set to a first polarity, and
a reset voltage of the first variable resistive layer and a set voltage of the second variable resistive layer are set to a second polarity opposite to the first polarity.

6. The nonvolatile variable resistive device according to claim 5, wherein after a first conductive filament is formed in the first variable resistive layer by applying a first set pulse voltage, a second conductive filament is formed in the second variable resistive layer by applying a second set pulse voltage whose absolute value of a drive voltage is smaller than a first reset pulse voltage and which is opposite in polarity to the first set pulse voltage.

7. The nonvolatile variable resistive device according to claim 6, wherein after the first conductive filament in the first variable resistive layer is made to disappear by applying the first reset pulse voltage, the second conductive filament in the second variable resistive layer is made to disappear by applying a second reset pulse voltage whose absolute value of a drive voltage is smaller than the first set pulse voltage and which is opposite in polarity to the first reset pulse voltage.

8. The nonvolatile variable resistive device according to claim 1, wherein a stacked structure of the first electrode, the first variable resistive layer, the second electrode, the second variable resistive layer, and the third electrode is arranged at an intersection of a word line and a bit line.

* * * * *